United States Patent
Choi et al.

(10) Patent No.: US 11,934,619 B2
(45) Date of Patent: *Mar. 19, 2024

(54) DISPLAY DEVICE AND METHOD FOR MANUFACTURING SAME

(71) Applicant: SAMSUNG DISPLAY CO., LTD., Yongin-si (KR)

(72) Inventors: Siyoung Choi, Asan-si (KR); Changbum Kim, Pyeongtaek-si (KR); Taejoon Kim, Seongnam-si (KR); Sangwook Yoo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/186,923

(22) Filed: Mar. 20, 2023

(65) Prior Publication Data

US 2023/0251748 A1    Aug. 10, 2023

Related U.S. Application Data

(63) Continuation of application No. 17/350,946, filed on Jun. 17, 2021, now Pat. No. 11,609,667.

(30) Foreign Application Priority Data

Aug. 18, 2020    (KR) .......................... 10-2020-0103428

(51) Int. Cl.
*G06F 3/044*    (2006.01)
*H10K 50/84*    (2023.01)
(Continued)

(52) U.S. Cl.
CPC .......... *G06F 3/0443* (2019.05); *G06F 3/0446* (2019.05); *H10K 50/841* (2023.02);
(Continued)

(58) Field of Classification Search
CPC .... G06F 3/0443; H10K 50/841; H10K 50/86; H10K 59/40; H10K 59/12; H10K 71/00
See application file for complete search history.

(56) References Cited

U.S. PATENT DOCUMENTS 8,603,611 B2    12/2013    Wakabayashi et al.
10,095,340 B2    10/2018    Choi
(Continued)

FOREIGN PATENT DOCUMENTS

JP          5970805 B2      8/2016
KR      10-1103535 B1      1/2012
(Continued)

*Primary Examiner* — Sardis F Azongha
(74) *Attorney, Agent, or Firm* — Lewis Roca Rothgerber Christie LLP

(57) ABSTRACT

A display device includes: a display panel configured to display an image; an input sensing substrate on the display panel; a flexible circuit film coupled to one side of an upper surface of the input sensing substrate; a step compensation film spaced apart from the flexible circuit film on the upper surface of the input sensing substrate; and an anti-reflection film on the flexible circuit film and the step compensation film, wherein the step compensation film comprises: a compensation layer on the upper surface of the input sensing substrate, and an overcoat layer between the compensation layer and the input sensing substrate.

20 Claims, 16 Drawing Sheets

(51) Int. Cl.
*H10K 50/86* (2023.01)
*H10K 59/12* (2023.01)
*H10K 59/40* (2023.01)
*H10K 71/00* (2023.01)
*G06F 3/041* (2006.01)

(52) U.S. Cl.
CPC ............ *H10K 50/86* (2023.02); *H10K 59/12* (2023.02); *H10K 59/40* (2023.02); *H10K 71/00* (2023.02); *G06F 3/04164* (2019.05); *G06F 2203/04103* (2013.01); *G06F 2203/04111* (2013.01); *H10K 59/1201* (2023.02)

(56) References Cited

U.S. PATENT DOCUMENTS

| | | |
|---|---|---|
| 10,534,459 B2 | 1/2020 | Lee et al. |
| 2017/0253719 A1 | 9/2017 | Morozumi et al. |
| 2018/0364835 A1 | 12/2018 | Kwon et al. |
| 2019/0198801 A1 | 6/2019 | Kuon et al. |
| 2019/0332211 A1 | 10/2019 | Jeon et al. |
| 2021/0132666 A1 | 5/2021 | Kim et al. |
| 2022/0013609 A1 | 1/2022 | Won et al. |

FOREIGN PATENT DOCUMENTS

| | | |
|---|---|---|
| KR | 10-1181926 B1 | 9/2012 |
| KR | 10-2018-0137748 A | 12/2018 |
| KR | 10-2020824 B1 | 10/2019 |
| KR | 10-2019-0124360 A | 11/2019 |
| KR | 10-2021-0054091 A | 5/2021 |
| KR | 10-2022-0006161 A | 1/2022 |

DISPLAY DEVICE AND METHOD FOR MANUFACTURING SAME

CROSS-REFERENCE TO RELATED APPLICATIONS

This application is a continuation of U.S. patent application Ser. No. 17/350,946, filed Jun. 17, 2021, which claims priority to and the benefit of Korean Patent Application No. 10-2020-0103428, filed Aug. 18, 2020, the entire content of both of which is incorporated herein by reference.

BACKGROUND

1. Field

Aspects of some embodiments of the present disclosure herein relate to a display device and a method for manufacturing the same.

2. Description of the Related Art

Electronic devices such as smart phones, tablets, laptop computers, and smart televisions are being developed. Such electronic devices are provided with display devices for providing information. Electronic devices have various electronic modules aside from display devices.

The display devices are each provided with an input sensing substrate as an input device. The input sensing substrate may be displayed on a display panel for displaying an image.

The above information disclosed in this Background section is only for enhancement of understanding of the background and therefore the information discussed in this Background section does not necessarily constitute prior art.

SUMMARY

Aspects of some embodiments of the present disclosure herein relate to a display device and a method for manufacturing the same, and for example, to a display device having a bezel region with a reduced width and a method for manufacturing the same.

Aspects of some embodiments of the present disclosure include a display device which includes an input sensing substrate located on a display panel and in which the width of a bezel region is relatively reduced.

According to some embodiments of the inventive concept, a display device includes: a display panel configured to display an image, an input sensing substrate on the display panel, a flexible circuit film coupled to one side of an upper surface of the input sensing substrate, a step compensation film spaced apart from the flexible circuit film on the upper surface of the input sensing substrate, and an anti-reflection film on the flexible circuit film and the step compensation film. The step compensation film includes a compensation layer on the upper surface of the input sensing substrate, and an overcoat layer between the compensation layer and the input sensing substrate.

According to some embodiments of the inventive concept, a display device includes: a display panel configured to display an image, an input sensing substrate on the display panel, a flexible circuit film coupled to one side of an upper surface of the input sensing substrate, a step compensation film spaced apart from the flexible circuit film on the upper surface of the input sensing substrate, and an anti-reflection film on the flexible circuit film and the step compensation film. The step compensation film includes an overcoat layer on the upper surface of the input sensing substrate and a barrier layer between the overcoat layer and the anti-reflection film and configured to block inflow of corrosive harmful matter from the anti-reflection film.

According to some embodiments of the inventive concept, a method for manufacturing a display device includes arranging an input sensing substrate on a display panel, coupling a flexible circuit film on one side of an upper surface of the input sensing substrate, laminating a preliminary compensation layer and a preliminary overcoat layer to form a preliminary step compensation film; coupling the preliminary step compensation film on the upper surface of the input sensing substrate, curing the preliminary step compensation film to form a step compensation film, and coupling an anti-reflection film on the step compensation film.

BRIEF DESCRIPTION OF THE DRAWINGS

The accompanying drawings are included to provide a further understanding of aspects of some example embodiments of the inventive concept, and are incorporated in and constitute a part of this specification. The drawings illustrate aspects of some embodiments of the inventive concept and, together with the description, serve to explain principles of the inventive concept. In the drawings.

DETAILED DESCRIPTION

In the description, it will be understood that when an element (or a region, a layer, portion, etc.) is referred to as being "on", "connected to" or "coupled to" another element or layer, it can be directly on, connected or coupled to the other element or a third intervening element may be present.

Like reference symbols refer to like elements. Also, in the figures, the thicknesses, the ratios and the dimensions of elements are exaggerated for effective illustration of technological contents.

The term "and/or" includes all of one or more combinations that can be defined by associated elements.

Although the terms such as "first" and "second" may be used herein to describe various elements, these elements should not be limited by these terms. The terms are only used to distinguish one element from other elements. For example, without departing from the scope of the present invention, a first component may be referred to as a second component, and similarly, the second component may also be referred to as the first component. Singular forms may include plural forms unless clearly defined otherwise in context.

In addition, terms such as "below", "lower", "above", and "upper" may be used to describe the relationship between features illustrated in the figures. The terms have relative concepts, and are described with respect to directions illustrated in the figures.

It will be further understood that the terms "includes" or "has", when used in this specification, specify the presence of stated features, numbers, steps, operations, elements, components or combinations thereof, but do not preclude the presence or addition of one or more other features, numbers, steps, operations, elements, components, and/or combinations thereof.

Hereinafter, embodiments of the inventive concept will be described with reference to the accompanying drawings.

Figure 1A:
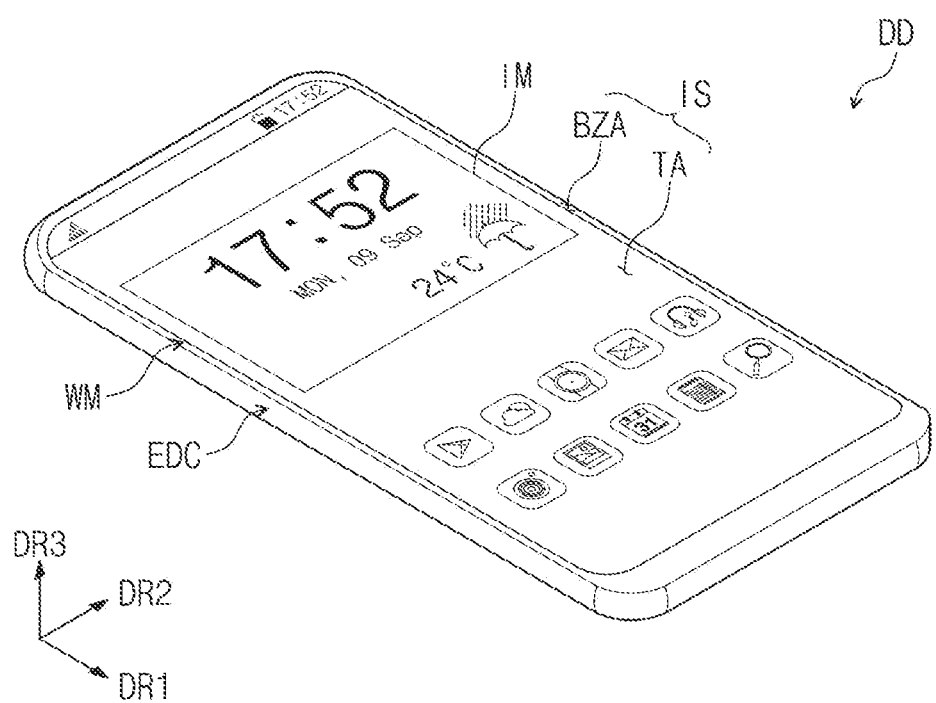
FIG. 1A is a perspective view illustrating a display device according to some embodiments of the inventive concept.
Figure 1B:
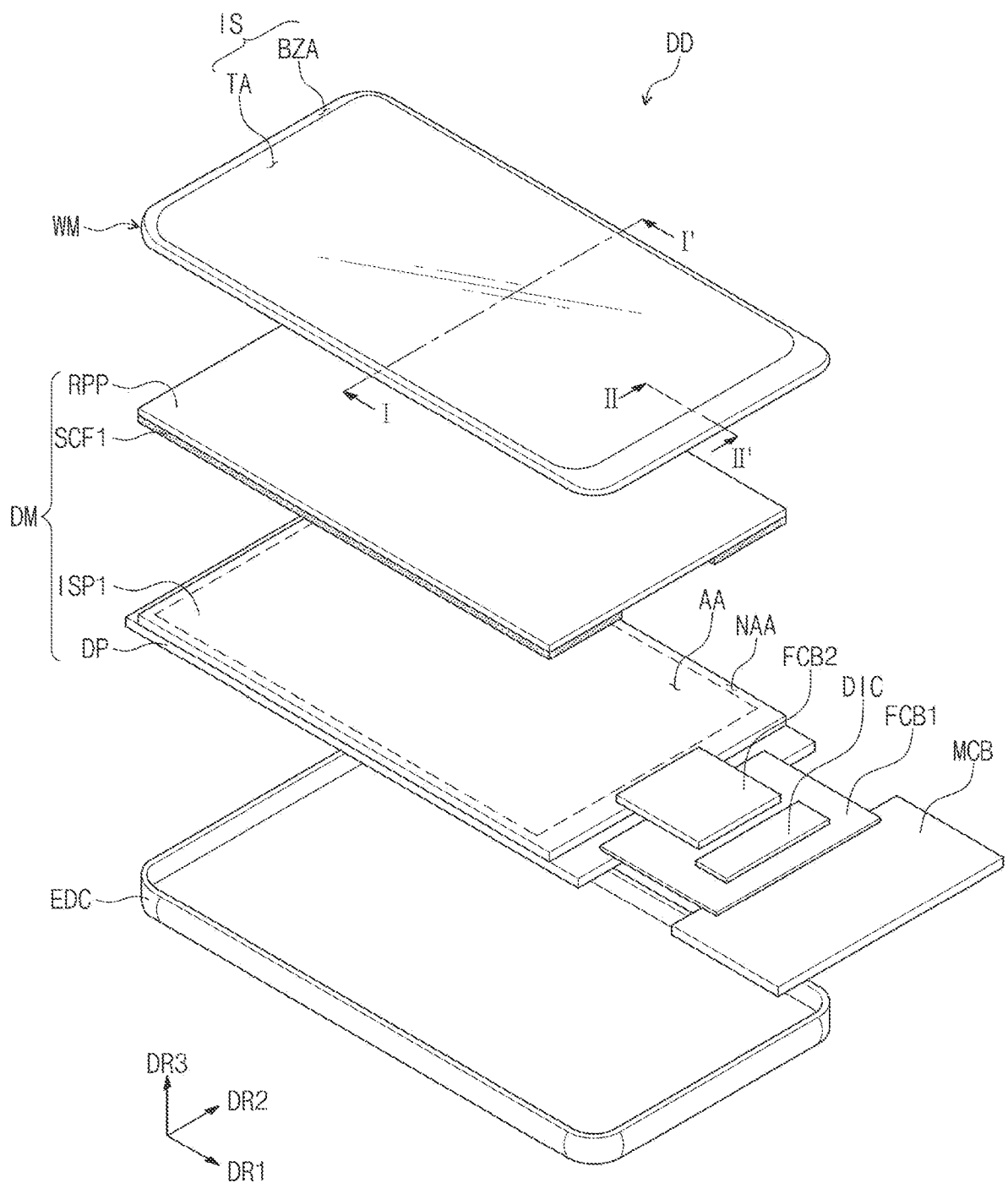
FIG. 1B is an exploded perspective view illustrating a display device according to some embodiments of the inventive concept.

FIG. 1A is a perspective view of a display device according to some embodiments of the inventive concept, and FIG. 1B is a cross-sectional view of a display device according to some embodiments of the inventive concept.

Referring to FIGS. 1A and 1B, the display device DD may be a device activated in response to an electrical signal. The display device DD may include various embodiments. For example, the display device DD may be applied to an electronic device, such as a smart watch, a tablet computer, a laptop computer, a computer, or a smart television.

The display device DD may display an image IM in a third direction DR3 on a display surface IS which is parallel to each of a first direction DR1 and a second direction DR2. That is, the display surface IS may be parallel to a plane defined by the first direction DR1 and DR2. The display surface IS on which an image IM is displayed may correspond to a front surface of the display device DD. The image IM may include not only a dynamic image but also a static image.

According to some embodiments, the front surface (or upper surface) and the rear surface (or lower surface) of each of members are defined with respect to the direction in which the image IM is displayed. The front surface and the rear surface may face each other in the third direction DR3, and the normal direction of each of the front surface and the rear surface may be parallel to the third direction DR3.

A spacing distance between the front surface and the rear surface in the third direction DR3 may correspond to a thickness of the display device DD in the third direction DR3. Meanwhile, the directions indicated by the first to third directions DR1, DR2 and DR3 have relative concepts and may be converted into other directions.

The display device DD may sense an external input applied from the outside. The external input may include inputs with various shapes provided from the outside of the display device DD. The external input applied from the outside may be provided in various forms.

For example, the external input may include not only contact with a portion of user's body such as a hand or finger (e.g., a touch input), but also external inputs (for example, hovering) applied at a distance (e.g., a set or predetermined small distance) or by approaching the display device DD. In addition, the external input may have various forms such as force, pressure, temperature and light.

The display surface IS of the display device DD may be divided into a transmissive region TA and a bezel region BZA. The transmissive region TA may be a region in which the image IM is displayed. A user views the image IM through the transmissive region TA. According to some embodiments, the corners of the transmissive region TA are illustrated as rounded rectangular shapes. However, this is illustrated as an example, and the transmissive region TA may have various shapes and the embodiments of the inventive concept are not limited thereto.

The bezel region BZA is adjacent to the transmissive region TA. The bezel region BZA may have a color (e.g., a set or predetermined color). The bezel region BZA may surround the transmissive region TA. Accordingly, the shape of the transmissive region TA may substantially be defined by the bezel region BZA. However, this is illustrated as an example, and the bezel region BZA may also be located adjacent to only one side of the transmissive region TA or may be omitted. The display device DD according to some embodiments of the inventive concept may have various embodiments, and the embodiments of the inventive concept are not limited to any one embodiment.

As illustrated in FIG. 1B, the display device DD may include a window WM, an outer case EDC, and a display module DM. The display module DM may include a display panel DP, an input sensing substrate ISP1, an anti-reflection film RPP and a step compensation film SCF1.

The window WM may be composed of a transparent material that may emit the image IM. For example, the widow may be composed of glass, sapphire, plastic or the like. The window WM is illustrated as a single layer, but the embodiments of the inventive concept are not limited thereto, and the window WM may include a plurality of layers. Meanwhile, according to some embodiments, the bezel region BZA of the display device DD may be provided substantially as a region in which a material including a color (e.g., a set or predetermined color) is printed in one region of the window WM.

The display panel DP according to some embodiments of the inventive concept may be a light-emitting display panel, and the embodiments of the inventive concept are not limited thereto. For example, the display panel DP may be an organic light-emitting display panel, an inorganic light-emitting display panel or a quantum dot light-emitting display panel. An emission layer of the organic light-emitting display panel may comprise an organic light-emitting material and an emission layer of the inorganic light-emitting display panel may comprise an inorganic light-emitting material. An emission layer of the quantum dot display panel may include quantum dots, quantum rods and the like. Hereinafter, the display panel DP is described as an organic light-emitting display panel.

The anti-reflection film RPP reduces reflectivity of external light incident from above the window WM. The anti-reflection film RPP according to some embodiments of the inventive concept may include a retardation layer and a polarization layer. The retardation layer may be a film type layer or a liquid crystal coating-type layer, and include λ/2 retarder and/or λ/4 retarder. The polarization layer may also be a film type layer or a liquid crystal coating-type layer. The film-type layer may include a stretchable synthetic resin film and the liquid crystal coating-type layer may include liquid crystals aligned in arrays (e.g., set or predetermined arrays). The retardation layer and the polarization layer may be implemented as a single polarization film. The anti-reflection film RPP may further include a protective film located on or under the polarization film.

The input sensing substrate ISP1 may be located on the display panel DP. According to some embodiments of the inventive concept, the input sensing substrate ISP1 may be fixed to the display panel DP by an adhesive film. The anti-reflection layer RPP may be located directly on the input sensing substrate ISP1. That is, the anti-reflection layer RPP may be located between the input sensing substrate ISP1 and the window WM.

The display module DM displays the image IM in response to an electrical signal and tranceives information on the external input. The display module DM may be defined by an active region AA and a peripheral region NAA. The active region AA may be defined as a region for emitting the image IM in a display module DM.

The peripheral region NAA is adjacent to the active region AA. For example, the peripheral region NAA may surround the active region AA. However, this is illustrated as an example, and the peripheral region NAA may be defined as various shapes, and the embodiments of the inventive concept are not limited to any one embodiment. According to some embodiments, the active region AA of the display module DM may correspond to at least a portion of the transmissive region TA.

The display module DM may further include a main circuit board MCB, a first flexible circuit film FCB1, a second flexible circuit film FCB2 and a drive chip DIC.

The main circuit board MCB may be connected to the first flexible circuit film FCB1 and may be electrically connected to the display panel DP. The main circuit board MCB may include a plurality of drive elements. The plurality of drive elements may include a circuit part for driving the display panel DP.

The first flexible circuit film FCB1 is connected to the display panel DP and may electrically connect the display panel DP and the main circuit board MCB. The drive chip DIC may be mounted on the first flexible circuit film FCB1.

The drive chip DIC may include drive elements for driving pixels of the display panel DP, for example, a data drive circuit. The single first flexible circuit film FCB1 according to some embodiments of the inventive concept is illustrated, but the embodiments of the inventive concept are not limited thereto, and the first flexible circuit film FCB1 may be provided in plurality and connected to the display panel DP.

The second flexible circuit film FCB2 may include a circuit part for controlling the input sensing substrate ISP1. In addition, in another example, the main circuit board MCB may include the circuit part for controlling the input sensing substrate ISP1, and in this case, the main circuit board MCB is connected to the second flexible circuit film FCB2 and may be electrically connected to the input sensing substrate ISP1.

The outer case EDC accommodates the display module DM. The outer case EDC may be coupled to the window WM and define the outer appearance of the display device DD. The outer case EDC absorbs shocks applied from the outside, prevents foreign substances infiltrating into the display module DM, and protects constituents accommodated in the outer case EDC. Meanwhile, according to some embodiments of the inventive concept, the outer case EDC may be provided in a shape in which a plurality of accommodation members is coupled.

The display device DD according to some embodiments may further include: an electronic module including various functional modules for operating the display module DM; a power supply module for supplying power required for overall operations of the display device DD; a bracket which is coupled to the display module DM and/or the outer case EDC and divides an inner space of the display device DD, and the like.

Figure 2A:
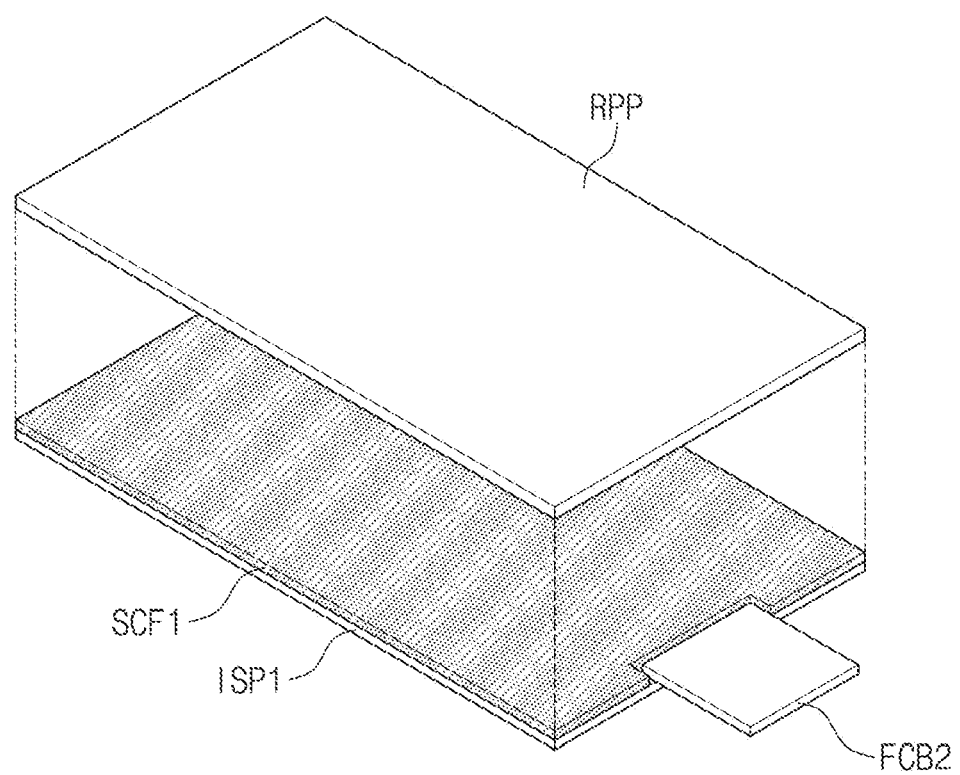
FIG. 2A is a perspective view illustrating a positional relationship of an input sensing substrate, an anti-reflection film, a step compensation film, and a second flexible circuit film according to some embodiments of the inventive concept.
Figure 2B:
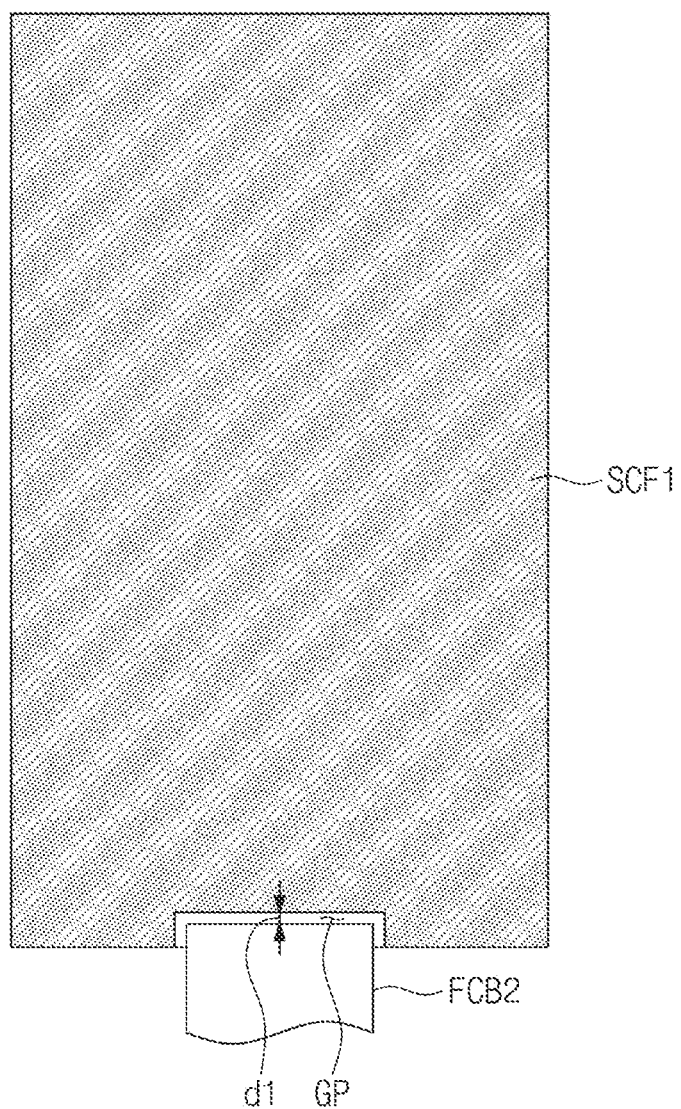
FIG. 2B is a plan view of the step compensation film and the second flexible circuit film illustrated in FIG. 2A according to some embodiments of the inventive concept.
Figure 3A:
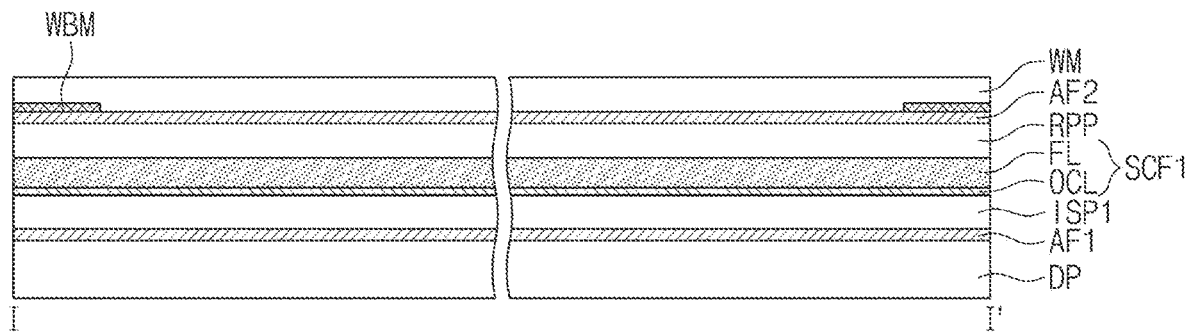
FIG. 3A is a cross-sectional view taken along the line I-I' illustrated in FIG. 1B according to some embodiments of the inventive concept.
Figure 3B:
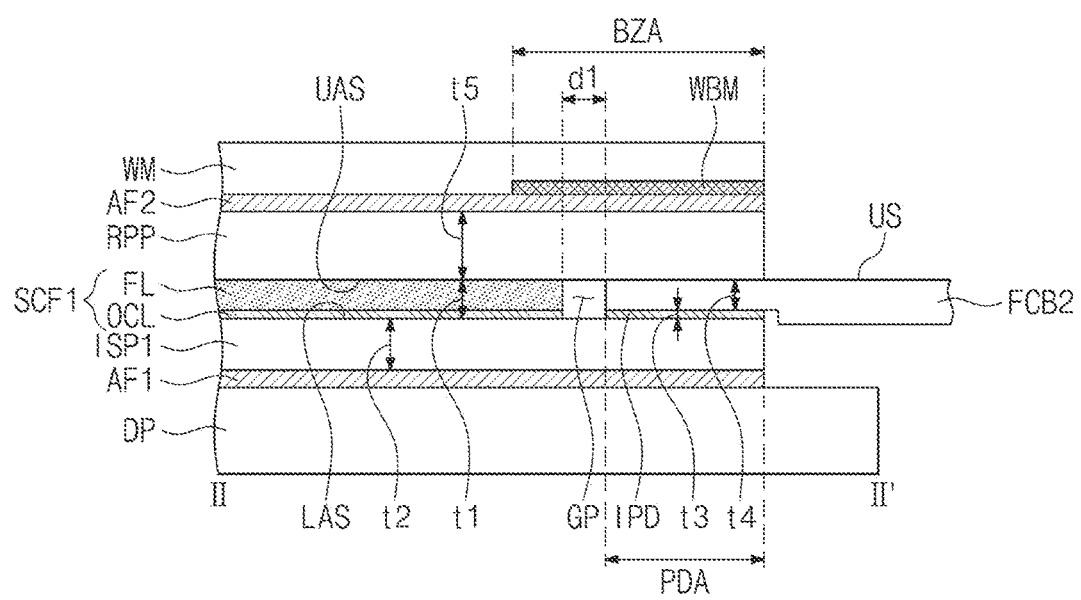
FIGS. 3B to 3D are cross-sectional views taken along a cut line II-II' illustrated in FIG. 1B according to some embodiments of the inventive concept.
Figure 3C:
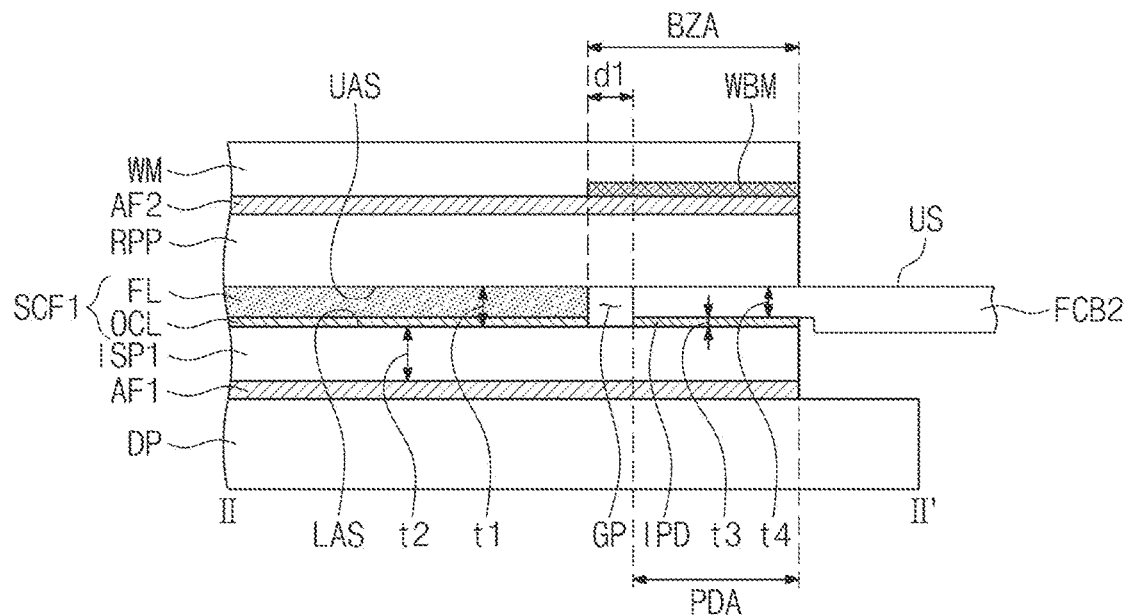

FIG. 2A is a perspective view illustrating a positional relationship of the input sensing substrate, the anti-reflection film, the step compensation film, and the second flexible circuit film which are illustrated in FIG. 1B, and FIG. 2B is a plan view of the step compensation film and the second flexible circuit film which are illustrated in FIG. 2A. FIG. 3A is a cross-sectional view cut along the cut line I-I' illustrated in FIG. 1B, and FIGS. 3B and 3C are cross-sectional views cut along the cut line II-II' illustrated in FIG. 1B.

Referring to FIGS. 2A to 3B, according to some embodiments of the inventive concept, the input sensing substrate ISP1 is provided separate from the display panel DP and be coupled to the display panel DP through a first adhesive film AF1.

The step compensation film SCF1 may be coupled to an upper surface LAS of the input sensing substrate ISP1. The step compensation film SCF1 may be located in remaining regions excluding a pad region PDA of the input sensing substrate ISP1. A plurality of pads IPD for coupling the input sensing substrate ISP1 to the second flexible circuit film FCB2 may be located on one side of the upper surface LAS of the input sensing substrate ISP1. Here, a region in which the pads IDP are located may be defined as the pad region PDA.

The input sensing substrate ISP1 is coupled to the second flexible circuit film FCB2 in the pad region PDA. The step compensation film SCF1 may be located in remaining regions excluding the pad region PDA so as to cover the upper surface LAS of the input sensing substrate ISP1. The step compensation film SCF1 may not overlap the second flexible film FCB2. According to some embodiments of the inventive concept, the step compensation film SCF1 may be arranged so as to be spaced a certain interval from the second flexible circuit film FCB2. An spacing distance between the step compensation film SCF1 and the second flexible circuit film FCB2 may be defined as a first distance d1.

An air gap GP is formed between the step compensation film SCF1 and the second flexible circuit film FCB2 by the first distance d1 formed by separating the step compensation film SCF1 and the second flexible circuit film FCB2. A distance between an end of the step compensation film SCF1 and an end of the second flexible circuit film FCB2 is maintained at the first distance d1, and thus, the air gap GP may be formed at a certain size along the end of the second flexible circuit film FCB2. Thus, be forming the separation between the step compensation film SCF1 and the second flexible film FCB2, the size of the air gap GP may be uniform or controlled to prevent or reduce unnecessary space from being utilized in the real estate or footprint of the bezel area BZA.

According to some embodiments of the inventive concept, the step compensation film SCF1 includes a compensation layer FL and an overcoat layer OCL. The compensation layer FL is located on the upper surface LAS of the input sensing substrate ISP1 and the overcoat layer OCL is located between the compensation layer FL and the input sensing substrate ISP1.

The compensation layer FL may contain an optically clear adhesive (OCA). However, the compensation layer FL may not be limited to the optically clear adhesive (OCA). When the compensation layer FL contains a material which is optically clear and has viscosity, the material may not be particularly limited.

The overcoat layer OCL may protect the input sensing substrate ISP1 from moisture/oxygen, and protect the input sensing substrate ISP1 from foreign substances such as dusts. According to some embodiments of the inventive concept, the overcoat layer OCL may contain a curable material and an adhesive material. The curable material may contain a photocurable material, such as a UV curable material. The adhesive material may be a material which is optically clear and has adhesiveness.

The compensation layer FL and the overcoat layer OCL may be laminated into a single film and form the step compensation film SCF1. The step compensation film SCF1 may be coupled on to the input sensing substrate ISP1 in a lamination method. That is, the compensation layer FL and the overcoat layer OCL may simultaneously be coupled to the input sensing substrate ISP1. The overcoat layer OCL may be cured by performing a curing process after the process in which the step compensation film SCF1 is laminated on the input sensing substrate ISP1. Adhesion between the overcoat layer OCL and the input sensing substrate ISP1 may be reinforced through the curing process. As a result, the overcoat layer OCL tightly coupled to the input sensing substrate ISP1 may stably protect the input sensing substrate ISP1 from moisture/oxygen and foreign substances.

According to some embodiments of the inventive concept, the step compensation film SCF1 formed by lamination of the compensation layer FL and the overcoat layer OCL is coupled to the input sensing substrate ISP1. Thus, the distance between the step compensation film SCF1 and the second flexible circuit film FCB2 may not be different from each other for each of the layers constituting the step compensation film SCF1. An end of the compensation layer FL and an end of the overcoat layer OCL may be positioned on the same line. Thus, the spacing distance d1 between the compensation layer FL and the second flexible circuit film FCB2 may substantially be the same as the spacing distance d1 between the overcoat layer OCL and the second flexible circuit film FCB2.

The anti-reflection film RPP may be located on the step compensation film SCF1. According to some embodiments of the inventive concept, the anti-reflection film RPP may include a polarization film. The anti-reflection film RPP may further include a protective film and other functional films aside from the polarization film.

The anti-reflection film RPP may be located directly on the step compensation film SCF1. That is, the anti-reflection film RPP may further include an adhesive layer located on the rear surface of the polarization film. Thus, the anti-reflection film RPP may be coupled to the upper surface UAS of the step compensation film SCF1 by the adhesive layer. According to some embodiments of the inventive concept, an adhesive film may be located between the anti-reflection film RPP and the step compensation film SCF1. That is, the adhesive film may be provided as a separate constituent from the anti-reflection film RPP.

As illustrated in FIGS. 2A and 3B, the anti-reflection film RPP may entirely cover the step compensation film SCF1, and the anti-reflection film RPP may cover the upper surface US of the second flexible circuit film FCB2 located in the pad region PDA. That is, the anti-reflection film RPP may partially overlap the second flexible circuit film FCB2.

According to some embodiments of the inventive concept, the step compensation film SCF1 may have a first thickness t1. The first thickness t1 of the step compensation film SCF1 may be greater or smaller than the thickness t4 of the second flexible circuit film FCB2. In addition, the first thickness t1 of the step compensation film SCF1 may be equal to or smaller than the distance between the anti-reflection film RPP and the input sensing substrate ISP1.

According to some embodiments of the inventive concept, the first thickness t1 may substantially be the same as the value of the sum of the thickness t4 of the second flexible circuit film FCB2 and the thickness t3 of the pads IPD. That is, in the pad region PDA, the interval from the upper surface US of the second flexible circuit film FCB2 to an upper surface LAS of the input sensing substrate ISP1 may substantially be the first thickness t1 of the step compensation film SCF1. According to some embodiments of the inventive concept, the first thickness t1 of the step compensation film SCF1 may be about 20 to 30 μm. Here the overcoat layer OCL may have a thickness of about 8 μm. The thickness of the compensation layer FL may vary according to the thickness t4 of the second flexible circuit film FCB2. That is, the thickness of the compensation layer FL may be set so that the height from the upper surface LAS of the input sensing substrate ISP1 to the upper surface US of the second flexible circuit film FCB2 may substantially be the same as the height from the upper surface LAS of the input sensing substrate ISP1 to the upper surface UAS of the compensation layer FL.

Meanwhile, the input sensing substrate ISP1 may have the second thickness t2. According to some embodiments of the inventive concept, the second thickness t2 of the input sensing substrate ISP1 may be about 20 micrometers (μm) to 45 μm.

Referring to FIG. 3B, in the pad region PDA and the remaining regions excluding the pad region PDA, the lower surface of the anti-reflection film RPP and the upper surface LAS of the input sensing substrate ISP1 may be maintained. That is, even when a step difference is formed between the second flexible circuit film FCB2 and the input sensing substrate ISP1, the distance between the lower surface of the anti-reflection film RPP and the upper surface LAS of the input sensing substrate ISP1 may be maintained by the step compensation film SCF1.

In addition, the air gap GP formed between the anti-reflection film RPP and the input sensing substrate ISP1 may be defined between an end of the step compensation film SCF1 and an end of the second flexible circuit film FCB2. That is, the position of the air gap GP may be determined by the step compensation film SCF1. When the step compensation film SCF1 is not utilized, the air gap GP may be located between the anti-reflection film RPP and the input sensing substrate ISP1 and may be formed irregularly without a standardized shape. In this case, the width of the bezel region BZA should be increased in order to cover the air gap GP. However, when the air gap GP is formed in a determined position by the step compensation film SCF1, it is possible to prevent an increase in the width of the bezel region BZA.

The window WM may be coupled on to the anti-reflection film RPP via the second adhesive film AF2. The window WM includes a window light-shield pattern WBM for defining the bezel region BZA. The window light-shield pattern WBM is a colored organic film and may be formed through a coating method. The window light-shield pattern WBM may be arranged so as to overlap the step compensation film SCF1. In this case, the width of the bezel region BZA may be the same as the width of the window light-shield pattern WBM, and be greater or equal to the width of the pad region PDA.

FIG. 3B illustrates further details according to some embodiments in which an end of the step compensation film SCF1 and an end of the window light-shield pattern WBM are not positioned on the same line, but the embodiments of the incentive concept are not limited thereto. That is, as illustrated in FIG. 3C, the end of the step compensation film SCF1 and the end of the window light-shield pattern WBM may be positioned on the same line. Thus, the region in which the air gap GP is formed may be covered by the window light-shield pattern WBM. In this case, the width of the bezel region BZA may be the same as the width of the window light-shield pattern WBM.

FIGS. 3B and 3C illustrate a structure in which the pads IPD do not overlap the air gap GP and the step compensation film SCF1, but the embodiments of the inventive concept are not limited thereto. That is, the pads IPD may overlap the air gap GP or overlap the air gap GP and the step compensation film SCF1.

Figure 3D:
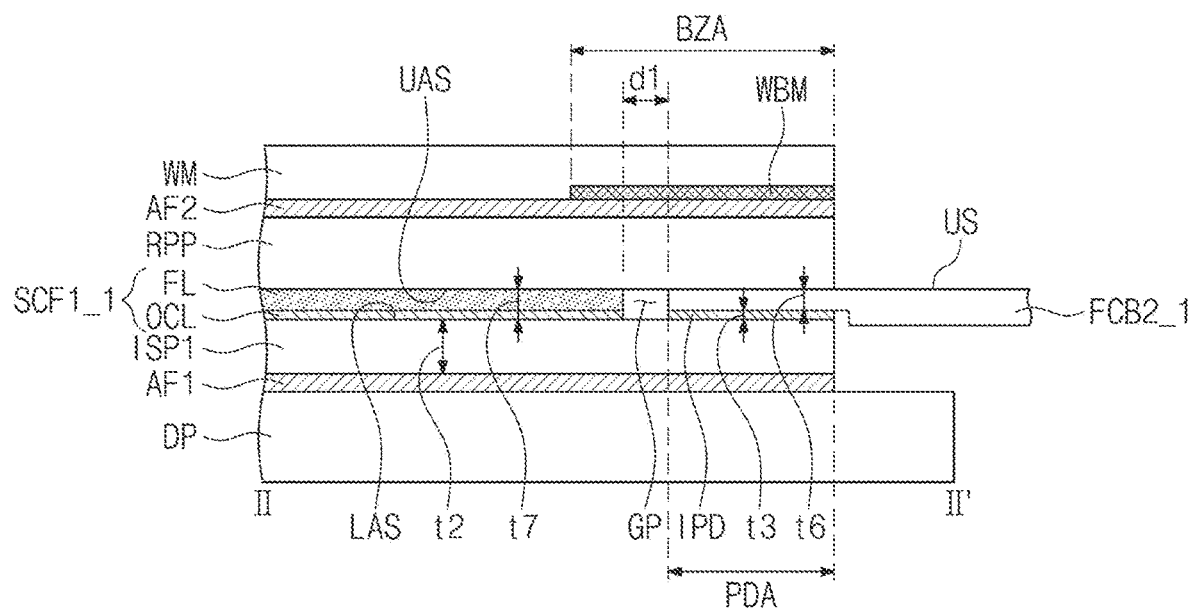

Referring to FIG. 3D, a second flexible circuit film FCB2_1 has a smaller thickness than the second flexible circuit film FCB2 illustrated in FIG. 3B. That is, a sixth thickness t6 of the second flexible circuit film FCB2_1 may be smaller than the fourth thickness t4 of the second flexible circuit film FCB2.

When the second flexible circuit film FCB2_1 has the sixth thickness t6 smaller than the fourth thickness t4, the thickness of a step compensation film SCF1_1 may also decrease. That is, the step compensation film SCF1_1 may have a seventh thickness t7 smaller than the first thickness t1. According to some embodiments of the inventive concept, the seventh thickness t7 of the step compensation film SCF1_1 may be about 20 µm to about 25 µm.

Figure 4A:
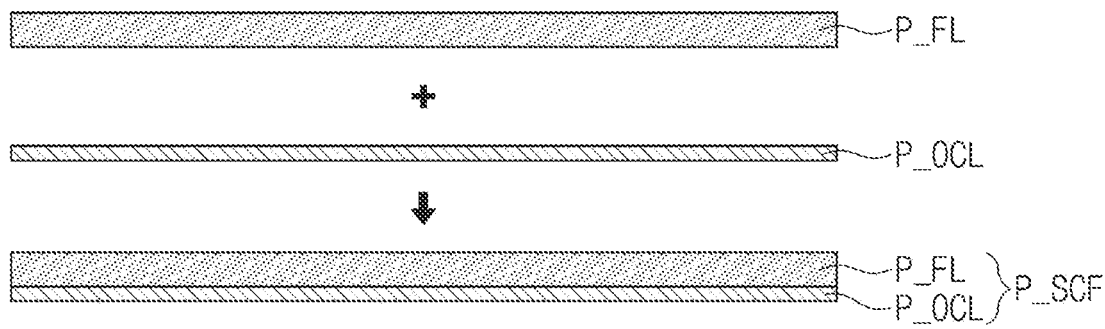
FIGS. 4A to 4C are process views each illustrating a process for coupling an input sensing substrate and a step compensation film according to some embodiments of the inventive concept.
Figure 4B:
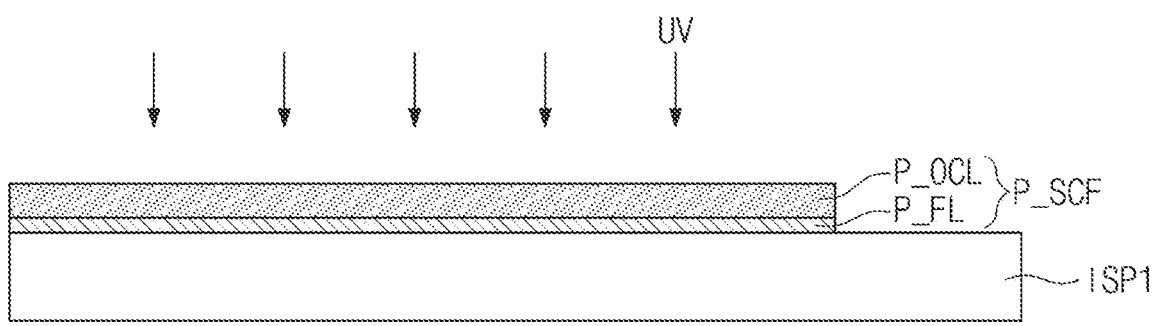
Figure 4C:
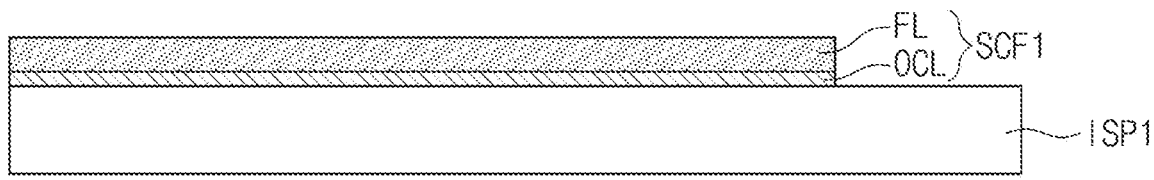

FIGS. 4A to 4C are process views each illustrating a process for coupling an input sensing substrate and a step compensation film.

Referring to FIG. 4A, the step compensation film SCF1_1 includes a preliminary compensation layer P_FL and a preliminary overcoat layer P_OCL. The preliminary compensation layer P_FL may contain an optically clear adhesive (OCA). However, the preliminary compensation layer P_FL may not be limited to the optically clear adhesive (OCA). When the preliminary compensation layer P_FL contains a material which is optically clear and has viscosity, the material thereof may not be particularly limited.

The preliminary overcoat layer P_OCL may contain a curable material and an adhesive material. The curable material may contain a photocurable material, such as a UV curable material. The adhesive material may be a material that is optically clear and has adhesiveness.

The preliminary compensation layer P_FL and the preliminary overcoat layer P_OCL may be laminated into a single film and form a step compensation film P_SCF. According to some embodiments, the preliminary step compensation film P_SCF may be cut after lamination so as to have a shape corresponding to the step compensation film SCF1. During a cutting process, the preliminary compensation layer P_FL and the preliminary overcoat layer P_OCL may simultaneously be cut. Thus, the cut surface of the preliminary compensation layer P_FL and the cut surface of the preliminary overcoat layer P_OCL may be positioned on the same line.

As illustrated in FIG. 4B, the preliminary step compensation film P_SCF may be coupled on to the input sensing substrate ISP1 through a lamination method. That is, the preliminary compensation layer P_FL and the preliminary overcoat layer P_OCL may simultaneously be coupled to the input sensing substrate ISP1. The preliminary overcoat layer P_OCL may be cured after a lamination process. The curing step may be performed by emitting UV from one side of the preliminary step compensation film P_SCF. An overcoat layer OCL is formed by curing the preliminary overcoat layer P_OCL after the curing process. That is, after the curing process, the overcoat layer OCL, to which the input sensing substrate ISP1 is tightly coupled, and the step compensation film SCF1, which includes a compensation layer FL and is provided on the overcoat layer OCL, are formed as illustrated in FIG. 4C. Adhesion between the overcoat layer OCL and the input sensing substrate ISP1 may be reinforced through the curing process. As a result, the overcoat layer OCL tightly coupled to the input sensing substrate ISP1 may stably protect the input sensing substrate ISP1 from moisture/oxygen and foreign substances.

Referring to FIGS. 3B and 4C, when the step compensation film SCF1 is manufactured through the above-described processes, an end of the compensation layer FL and an end of the overcoat layer OCL may be positioned on the same line. This, after the step compensation film SCF1 is coupled to the input sensing substrate ISP1, the measured spacing distance d1 between the compensation layer FL and the second flexible circuit film FCB2 may substantially be the same as the spacing distance d1 between the overcoat layer OCL and the second flexible circuit film FCB2. Accordingly, an additional margin which should be secured in the bezel region BZA due to a deviation in the distance between the end of the compensation layer FL and the end of the overcoat layer OCL may be removed, and as a result, an increase in the width of the bezel region BZA may be prevented.

Figure 5A:
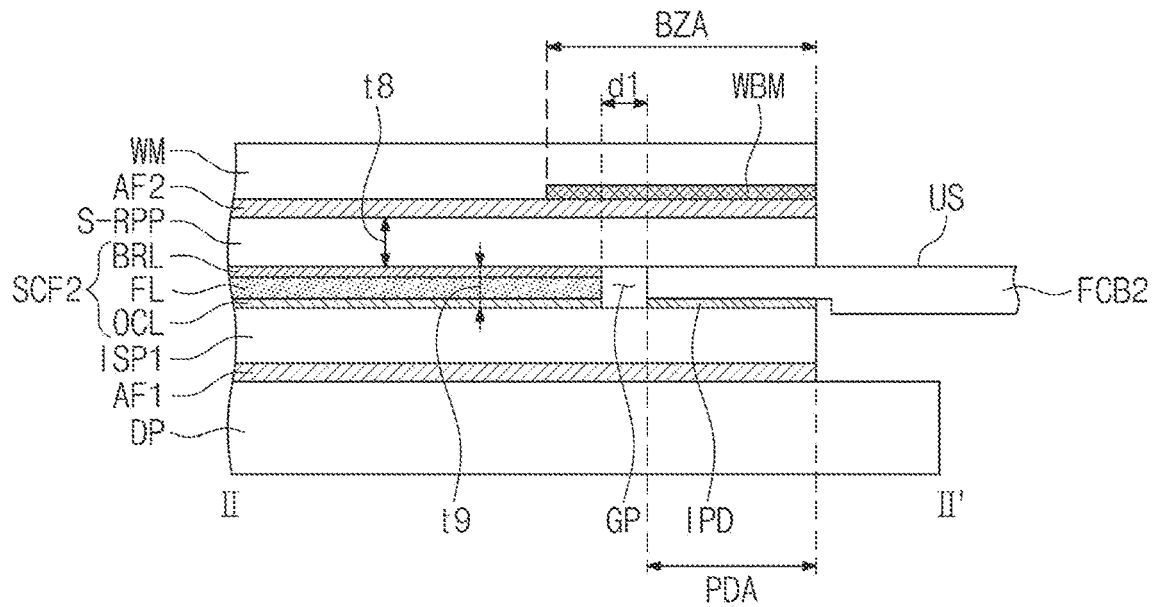
FIG. 5A is a cross-sectional view taken along a cut line II-II' illustrated in FIG. 1B according to some embodiments of the inventive concept.
Figure 5B:
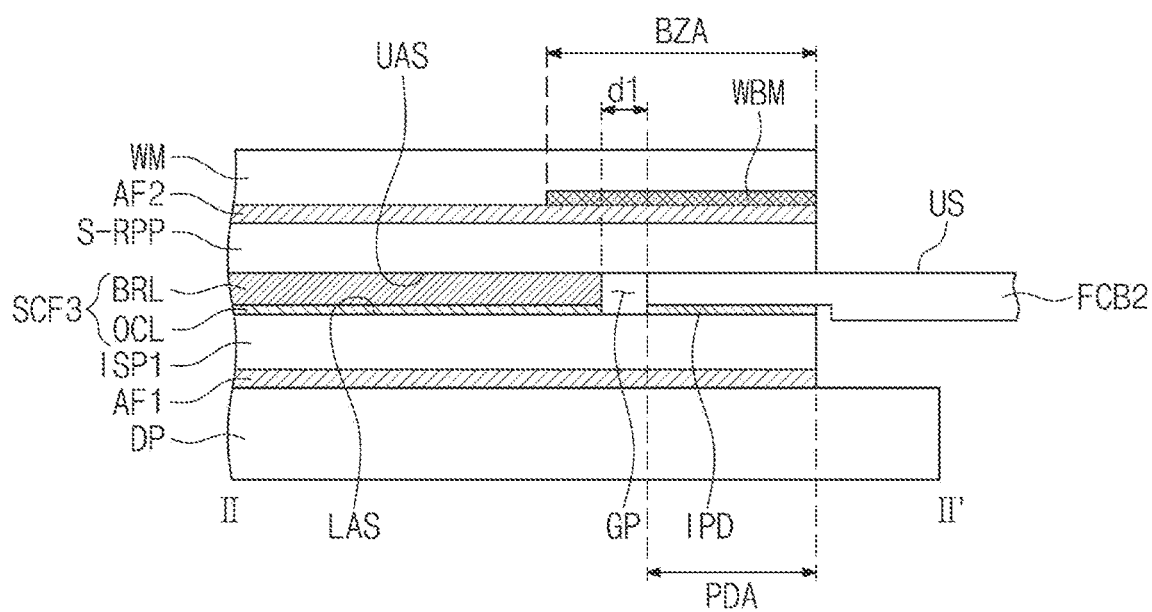
FIG. 5B is a cross-sectional view taken along the cut line II-II' illustrated in FIG. 1B according to some embodiments of the inventive concept.

FIG. 5A is a cross-sectional view taken along a cut line II-II' illustrated in FIG. 1B according to some embodiments of the inventive concept, and FIG. 5B is a cross-sectional view taken along the cut line II-II' illustrated in FIG. 1B according to some embodiments of the inventive concept. Among the constituents illustrated in FIGS. 5A and 5B, the same constituents as the constituents illustrated in FIGS. 3B to 3D will be referred to by the same reference symbols, and specific descriptions thereon will be omitted.

Referring to FIG. 5A, a step compensation film SCF2 may be coupled to the upper surface of the input sensing substrate ISP1. The step compensation film SCF2 may be located in the remaining regions excluding the pad region PDA in the input sensing substrate ISP1. A plurality of pads IPD for being coupled to the second flexible circuit film FCB2 may be located on one side of the upper surface of the input sensing substrate ISP1. Here, the region in which the pads IDP are located may be defined as the pad region PDA.

The step compensation film SCF2 may be located in the remaining regions excluding the pad region PDA so as to cover the upper surface of the input sensing substrate ISP1. The step compensation film SCF2 may not overlap the second flexible film FCB2. According to some embodiments of the inventive concept, the step compensation film SCF2 may be arranged so as to be spaced a certain interval from the second flexible circuit film FCB2. The spacing distance between the step compensation film SCF2 and the second flexible circuit film FCB2 may be defined as a first distance d1.

An air gap GP is formed between the step compensation film SCF2 and the second flexible circuit film FCB2 by the first distance d1 formed by separating the step compensation film SCF2 and the second flexible circuit film FCB2. The distance between an end of the step compensation film SCF2 and an end of the second flexible circuit film FCB2 is maintained at the first distance d1, and thus, the air gap GP may be formed at a certain size along the end of the second flexible circuit film FCB2.

An anti-reflection film S_RPP1 may be located directly on the step compensation film SCF2. According to some embodiments of the inventive concept, the anti-reflection film S_RPP1 may include a polarization film. The anti-reflection film S_RPP1 illustrated in FIG. 5A may have smaller thicknesses than the anti-reflection film RPP illustrated in FIGS. 3B to 3D. The anti-reflection film S_RPP1 which is illustrated in FIG. 5A may be referred to as a slim-type anti-reflection film.

The anti-reflection film RPP and the slim-type anti-reflection film S_RPP1 will be specifically described later with reference to FIGS. 6A to 6C.

When the slim-type anti-reflection film S_RPP1 is located on the step compensation film SCF2, the step compensation film SCF2 may further include a barrier layer BRL aside from the compensation layer FL and the overcoat layer OCL. The barrier layer BRL may prevent corrosive matter introduced from the slim-type anti-reflection film S_RPP1 from being provided to the input sensing substrate ISP1. According to some embodiments of the inventive concept, the corrosive material may include iodine etc. When a corrosive harmful matter is provided to the input sensing substrate ISP1, electrodes or the like provided in the input sensing substrate ISP1 may be corroded by the corrosive harmful matter.

The barrier layer BRL may contain any one material among a cyclic olefin polymer (COP), polycarbonate (PC) or polyimide (PI). However, the material of the barrier layer BRL are not particularly limited as long as the material is capable of blocking corrosive harmful matter aside from the above-described material.

The compensation layer FL, the overcoat layer OCL, and the barrier layer BRL may be laminated into a single film and form the step compensation film SCF2. The step compensation film SCF2 may be coupled on to the input sensing substrate ISP1 through a lamination method. That is, the compensation layer FL, the overcoat layer OCL, and the barrier layer BRL may simultaneously be coupled to the input sensing substrate ISP1.

According to some embodiments of the inventive concept, the step compensation film SCF2 formed by lamination of the compensation layer FL, the overcoat layer OCL, and the barrier layer BRL is coupled to the input sensing substrate ISP1. Thus, the distance between the step compensation film SCF2 and the second flexible circuit film FCB2 may not be different from each other for each of the layers constituting the step compensation film SCF2. That is, the spacing distance d1 between the compensation layer FL and the second flexible circuit film FCB2 may substantially be the same as the spacing distance d1 between the overcoat layer OCL and the second flexible circuit film FCB2.

Referring to FIG. 5A, the step compensation film SCF2 may have a ninth thickness t9. The ninth thickness t9 of the step compensation film SCF2 may be greater than or equal to the thickness t4 (see FIG. 3B) of the second flexible circuit film FCB2. In addition, the ninth thickness t9 of the step compensation film SCF2 may be equal to or smaller than the distance between the slim-type anti-reflection film S_RPP1 and the input sensing substrate ISP1 which are spaced apart by the second flexible circuit film FCB2.

According to some embodiments of the inventive concept, the ninth thickness t9 may substantially be the same as the value of the sum of the thickness t4 of the second flexible circuit film FCB2 and the thickness t3 of the pads IPD. That is, in the pad region PDA, the interval between the upper surface US of the second flexible circuit film FCB2 to the upper surface LAS of the input sensing substrate ISP1 may substantially be the same as the thickness t9 of the step compensation film SCF2. According to some embodiments of the inventive concept, the ninth thickness t9 of the step compensation film SCF2 may be about 20 µm to about 30 µm.

As illustrated in FIG. 5B, when a slim-type anti-reflection film S_RPP2 is utilized, the display device DD (shown in FIG. 1B) may include a step compensation film SCF3 including an overcoat layer OCL and a barrier layer BRL. The barrier layer BRL may prevent corrosive matter introduced from the slim-type reflection film S_RPP2 from being provided to the input sensing substrate ISP1. In addition, the step between the second flexible circuit film FCB2 and the input sensing unit ISP1 by adjusting the thickness of the barrier layer BRL. That is, the thickness of the barrier layer BRL may be set so that the height from the upper surface LAS of the input sensing substrate ISP1 to the upper surface US of the second flexible circuit film FCB2 may substantially be the same as the height from the upper surface LAS of the input sensing substrate ISP1 to the upper surface UAS of the barrier layer BRL.

The overcoat layer OCL and the barrier layer BRL may be laminated into a single film and form the step compensation film SCF3. The step compensation film SCF3 may be coupled on to the input sensing substrate ISP1 through a lamination method. That is, the overcoat layer OCL and the barrier layer BRL may simultaneously be coupled to the input sensing substrate ISP1. According to some embodiments, the step compensation film SCF3 may further include an adhesive layer located between the barrier layer BRL and the overcoat layer OCL. That is, the barrier layer BRL and the overcoat layer OCL may be coupled by the adhesive layer.

Figure 6A:
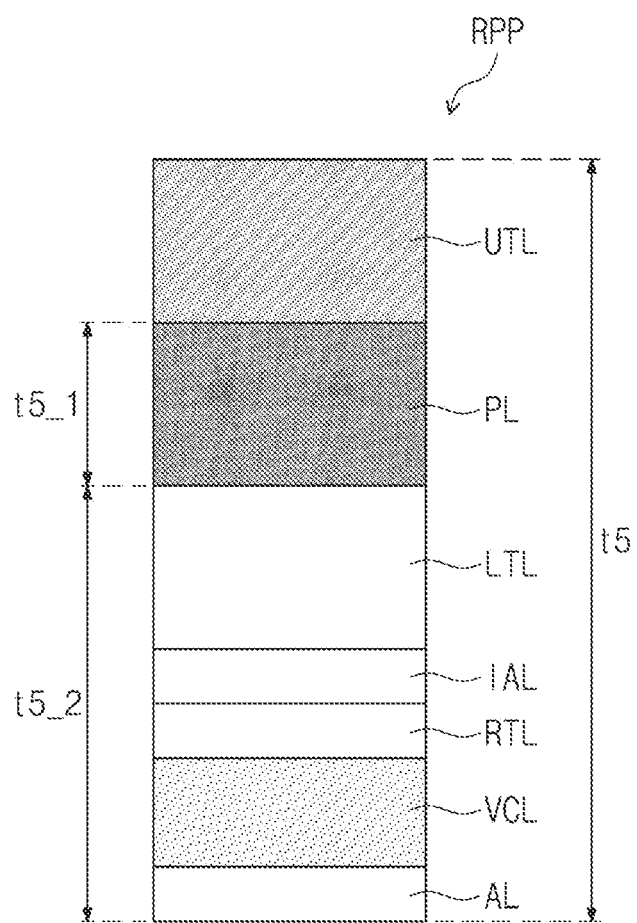
FIG. 6A is a cross-sectional view of the structure of the anti-reflection film illustrated in FIGS. 3B to 3D according to some embodiments of the inventive concept.

FIG. 6A is a cross-sectional view of the anti-reflection film illustrated in FIGS. 3B to 3D; FIGS. 6B and 6C are cross-sectional views illustrating the slim-type anti-reflection films illustrated in FIGS. 5A and 5B.

Referring to FIGS. 3B and 6A, the anti-reflection film RPP may include a polarization layer PL, a first protective layer UTL and a second protective layer LTL.

The polarization layer PL may have a transmission axis and an absorption axis perpendicular to the transmission axis. Thus, the polarization layer PL does not absorb or reflect and pass a component parallel to the absorption axis among the component of incident light, but pass only the component parallel to the transmission axis. The polarization layer PL is composed of a polymer resin elongated in a specific direction. The polymer resin may be a polyvinyl alcohol resin. The polyvinyl alcohol resin is obtained by saponification of a polyvinyl acetate resin. The polyvinyl acetate resin includes a copolymer obtained by copolymerizing a single polymer of vinyl acetate or a monomer copolymerizable with the vinyl acetate. Examples of monomers copolymerizable with vinyl acetate include unsaturated carboxylic acid, olefin, vinyl ether and unsaturated sulfonic acid.

The first protective layer UTL is located on the polarization layer PL and protects the upper surface of the polarization layer PL, and the second protective layer LTL is located under the polarization layer PL and protects the lower surface of the polarization layer PL. The first and second protective layers UTL and LTL may be cellulose-based polymer such as triacetate cellulose (TAC). In addition, the first protective layer UTL may further include a hard coating material.

The anti-reflection film RPP may further include a retardation layer RTL and a viewing angle compensation layer VCL. The retardation layer RTL and the viewing angle compensation layer VCL may be located under the polarization layer PL. That is, the retardation layer RTL and the viewing angle compensation layer VCL may be located between the polarization layer PL and the step compensation film SCF1. The retardation layer RTL may include λ/2 retarder and/or λ/4 retarder. The viewing angle compensation layer VCL is provided to adjust the viewing angle of light incident to the polarization layer PL. At least one among the retardation layer RTL or the viewing angle compensation layer VCL may be omitted.

The anti-reflection film RPP may further include an inner adhesive layer IAL and an adhesive layer AL. The inner adhesive layer IAL is provided between the retardation layer RTL and the second protective layer LTL, and the adhesive layer AL is provided to the rear surface of the viewing angle compensation layer VCL. The inner adhesive layer IAL couples the retardation layer RTL and the second protective layer LTL, and the adhesive layer AL couples the anti-reflection film RPP to the step compensation film SCF1. According to some embodiments of the inventive concept, the inner adhesive layer IAL and the adhesive layer AL may each include a pressure sensitive agent (PSA).

The anti-reflection film RPP may have a fifth thickness t5. According to some embodiments of the inventive concept, the fifth thickness may be about 147 μm. Here, the polarization layer PL may have a first inner thickness t5_1 and the total thickness t5_2 of the layers LTL, IAL, RTL, VCL and AL located under the polarization layer PL may be greater than the first inner thickness t5_1. Here, the total thickness t5_2 of the layers LTL, IAL, RTL, VCL and AL located under the polarization layer PL may be referred to as a second inner thickness t5_2. Here, a distance between the polarization layer PL and the step compensation film SCF1 may have the same value as the second inner thickness t5_2.

In general, corrosive harmful matter flowing out from the anti-reflection film RPP may be caused in the polarization layer PL. Thus, the larger the distance between the polarization layer PL and the input sensing substrate ISP1, the lower the probability of inflow of the corrosive harmful mater into the input sensing substrate ISP1. That is, in the anti-reflection film RPP, the second inner thickness t5_2 may serve as an important factor that determines whether the corrosive harmful matter flow into the input sensing substrate ISP1.

When the second inner thickness t5_2 is sufficiently large, the barrier layer BRL (shown in FIGS. 5A and 5B) for blocking inflow of the corrosive armful matter in the display device DD may be omitted.

Figure 6B:
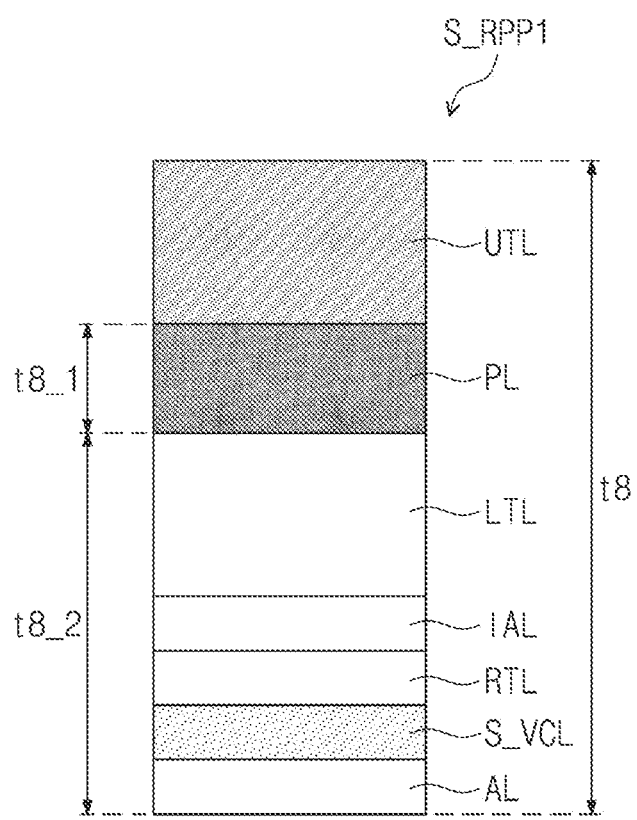
FIG. 6B is a cross-sectional view of a structure of a slim-type anti-reflection film illustrated in FIG. 5A according to some embodiments of the inventive concept.
Figure 6C:
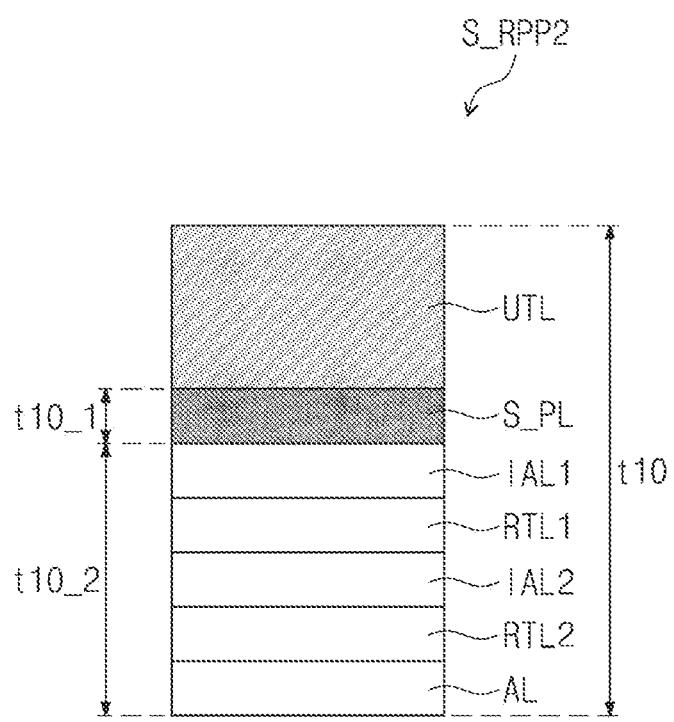
FIG. 6C is a cross-sectional view of a structure of a slim-type anti-reflection film illustrated in FIG. 5B according to some embodiments of the inventive concept.

However, as illustrated in FIGS. 5A, 5B, and 6C, when the slim-type anti-reflection films S_RPP1 and S_RPP2 are adopted in the display device DD, the display device DD may further include the barrier layer BRL.

Referring to FIGS. 5A and 6B, the slim-type anti-reflection film S_RPP1 may include a polarization layer PL, first and second protective layers UTL and LTL, a retardation layer RTL, a slim-type viewing angel compensation layer S_VCL, an inner adhesive layer IAL and an the adhesive layer AL. That is, in preparation for the anti-reflection film RPP illustrated in FIG. 6A, the slim-type anti-reflection film S_RPP1 includes the slim-type viewing angel compensation layer S_VCL having a smaller thickness than the viewing angel compensation layer VCL. The thickness t8_1 of the polarization layer PL of the slim-type anti-reflection film S_RPP1 may be equal to the thickness t5_1 of the polarization layer PL of the anti-reflection film RPP. According to some embodiments of the inventive concept, the thickness t8 of the slim-type anti-reflection film S_RPP1 may be about 106 μm.

A total thickness (that is, a second inner thickness t8_2) of the layers LTL, IAL, RTL, S_VCL and AL which are located under the polarization layer PL in the slim-type anti-reflection film S_RPP1 may be decreased as much as the decreased thickness of the slim-type viewing angel compensation layer S_VCL. That is, the second inner thickness t8_2 of the slim-type anti-reflection film S_RPP1 may be smaller than the second inner thickness t5_2 in the anti-reflection film RPP. As the second inner thickness t8_2 of the slim-type anti-reflection film S_RPP1 decreases, the probability rises in which the corrosive harmful matter caused from the polarization layer PL flows into the input sensing substrate ISP1. Thus, as illustrated in FIG. 5A, the barrier layer BRL is provided between the input sensing substrate ISP1 and the slim-type anti-reflection film S_RPP1. In particular, the barrier layer BRL is provided as a single layer constituting the step compensation film SCF2. When the barrier layer BRL is added to the step compensation film SCF2, the thickness of the compensation layer FL may be decreased by the thickness of the barrier layer BRL. Thus, even when the barrier layer BRL is added, the total thickness of the step compensation film SCF2 may not increase compared to that of the step compensation film SCF1 (shown in FIG. 3B) which is not provided with the barrier layer BRL.

Referring to FIG. 6C, the slim-type anti-reflection film S_RPP2 may include a slim-type polarization layer S_PL, a first protective layer UTL, a first retardation layer RTL1, a second retardation layer RTL2, first and second inner adhesive layers IAL and IAL2, and an adhesive layer AL. That is, compared to the anti-reflection film RPP illustrated in FIG. 6A, the slim-type anti-reflection film S_RPP2 is not provided with the second protective layer LTL (refer to FIG.

6A) and the viewing angle compensation layer VCL (refer to FIG. 6A), but provided with a slim-type polarization layer S_PL having a smaller thickness t10_1 than that of the polarization layer PL. According to some embodiments of the inventive concept, the slim-type anti-reflection film S_RPP2 may have a thickness t10 of about 55 μm.

In the slim-type anti-reflection film S_RPP2, a total thickness (that is, a second inner thickness t10_2) of the layers IAL1, RTL1, IAL2, RTL2 and AL which are located under the slim-type polarization layer S_PL may be smaller than the second inner thickness t8_2 illustrated in FIG. 6B. As the second inner thickness t10_2 of the slim-type anti-reflection film S_RPP2 decreases, the probability rises in which the corrosive harmful matter caused from the slim-type polarization layer S_PL flows into the input sensing substrate ISP1. Thus, as illustrated in FIG. 5B, the barrier layer BRL is provided between the input sensing substrate ISP1 and the slim-type anti-reflection film S_RPP2. In particular, the barrier layer BRL is provided as a single layer constituting the step compensation film SCF3. The thickness of the barrier layer BRL provided to the step compensation film SCF3 may be greater than the thickness of the barrier layer BRL provided to the step compensation film SCF2. Thus, even when the slim-type anti-reflection film S_RPP2 has a smaller second inner thickness t10_2 than that of the slim-type anti-reflection film S_RPP1, the corrosive harmful matter may be efficiently blocked by the barrier layer BRL.

Figure 7A:
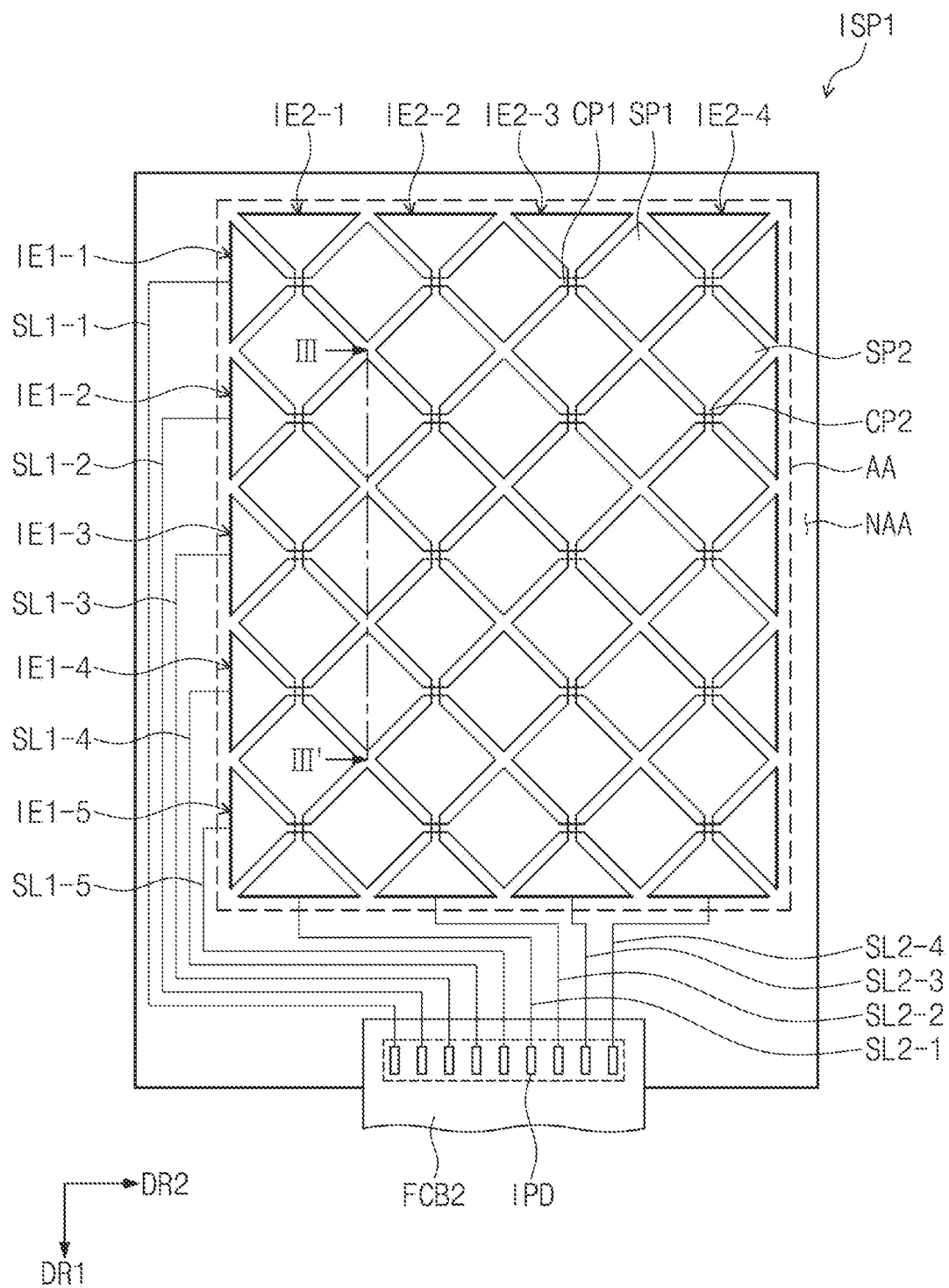
FIG. 7A is a plan view illustrating the configuration of an input sensing substrate according to some embodiments of the inventive concept.
Figure 7B:
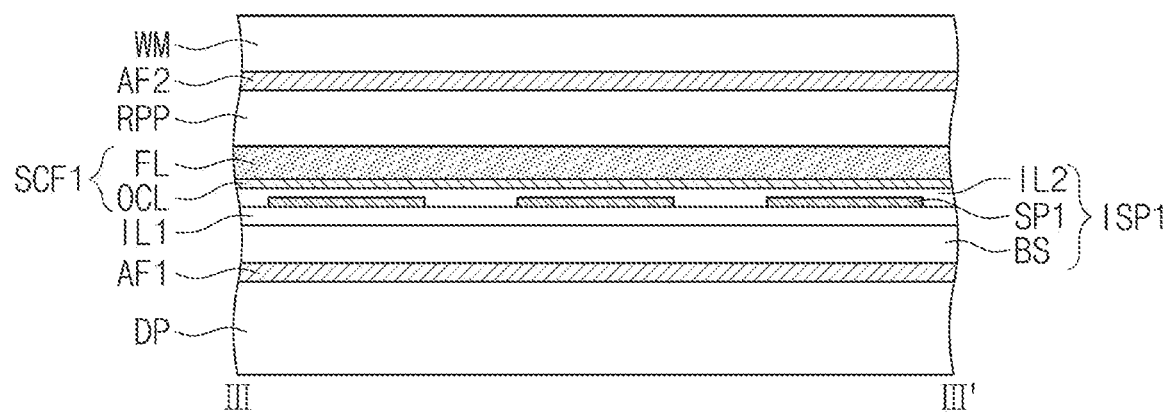
FIG. 7B is a cross-sectional view taken along the cut line III-III' illustrated in FIG. 7A according to some embodiments of the inventive concept.

FIG. 7A is a plan view illustrating the configuration of an input sensing substrate according to some embodiments of the inventive concept, and FIG. 7B is a cross-sectional view taken along the cut line III-III' illustrated in FIG. 7A. Among the constituents illustrated in FIG. 7B, the same constituents as the constituents illustrated in FIGS. 3B to 3D will be referred to by the same reference symbols, and specific descriptions thereon will be omitted.

Referring to FIGS. 7A and 7B, the input sensing substrate ISP1 according to some embodiments of the inventive concept may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4.

The first sensing electrodes IE1-1 to IE1-5 and the second sensing electrodes IE2-1 to IE2-4 cross each other. The first sensing electrodes IE1-1 to IE1-5 are arranged in the first direction DR1 and each extend in the second direction DR2. The second sensing electrodes IE2-1 to IE2-4 are arranged in the second direction DR2 and each extend in the first direction DR1.

The first sensing electrodes IE1-1 to IE1-5 may each include first sensor parts SP1 and first connection parts CP1 which are located in the active region AA. The second sensing electrodes IE2-1 to IE2-4 may each include second sensor parts SP2 and second connection parts CP2 which are located in the active region AA. Among the first sensor parts SP1, two first sensor parts SP1 located on both ends of each of the first sensing electrodes IE1-1 to IE1-5 may have a smaller size, for example, a half size, than the first sensor parts SP1 located at the central of each of the first sensing electrodes IE1-1 to IE1-5. Among the second sensor parts SP2, two second sensor parts SP2 located on both ends of each of the second sensing electrodes IE2-1 to IE2-4 may have a smaller size, for example, a half size, than the second sensor parts SP2 located at the center of each of the second sensing electrodes IE2-1 to IE2-4.

FIG. 7A illustrates the first sensing electrodes IE1-1 to IE1-5 and the second sensing electrodes IE2-1 to IE2-4 according to some embodiments, but the shapes thereof are not limited. According to some embodiments of the incentive concept, the first sensing electrodes IE1-1 to IE1-5 and the second sensing electrodes IE2-1 to IE2-4 may have shapes (for example, bar shapes) in which sensor parts and connection parts are not divided. The first sensor parts SP1 and the second sensor parts SP2 which have diamond shapes are illustrated as an example, but the embodiments of the inventive concept are not limited thereto, and the first sensor parts SP1 and the second sensor parts SP2 may have any other suitable polygonal shapes.

In a single first sensing electrode, the first sensor parts SP1 are arranged in the second direction DR2, and in a single second electrode, the second sensor parts SP2 are arranged in the first direction DR1. The first connection parts CP1 each connect the adjacent first sensor parts SP1 and the second connection parts CP2 each connect the adjacent second sensor parts SP2.

The first signal lines SL1-1 to SL1-5 are respectively connected to one ends of the first sensing electrodes IE1_1 to IE1_5. The second signal lines SL2-1 to SL2-4 are respectively connected to one ends of the second sensing electrodes IE2_1 to IE2_4. According to some embodiments of the inventive concept, the first signal lines SL1-1 to SL1-5 are further respectively connected to opposite ends of the first sensing electrodes IE1_1 to IE1_5. In addition, the second signal lines SL2-1 to SL2-4 are further respectively connected to opposite ends of the second sensing electrodes IE2_1 to IE2_4. The first signal lines SL1-1 to SL1-5 and the second signal lines SL2-1 to SL2-4 may be located in the peripheral region NAA.

The input sensing substrate ISP1 may extend from one ends of the first signal lines SL1-1 to SL1-5 and the second signal lines SL2-1 to SL2-4 and include pads IPD located in the peripheral region NAA.

As illustrated in FIG. 7B, the input sensing substrate ISP1 according to some embodiments of the inventive concept may include a base layer BS, first and second conductive layer, and first and second insulating layers IL1 and IL2. The base layer BS may contain an optically clear plastic material. According to some embodiments of the inventive concept, the base layer BS may contain a cyclic olefin polymer (COP) material.

The first conductive layer may be formed on the base layer BS. According to some embodiments of the inventive concept, the first conductive layer may include one of the first and second connection parts. The second conductive layer may include the first and second sensing parts SP1 and SP2 and the remaining connection part. The first and second conductive layers may each include a metallic layer or a transparent conductive layer. The metallic layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO) or indium tin zinc oxide (ITZO). Besides, the transparent conductive layer may include a conductive polymer such as PEDOT, a metal nanowire, or graphene.

The first insulating layer IL1 may have a single-layer or a multi-layer structure. The first insulating layer IL1 may include an inorganic film, an organic film, or a composite material. The inorganic film may include at least one among aluminum oxide, titanium oxide, silicon oxide, silicon oxynitride, zirconium oxide, or hafnium oxide. The organic film may include at least any one among an acryl resin, a methacrylic resin, a polyisoprene vinyl resin, an epoxy resin, a urethane resin, a cellulose resin, a siloxane resin, a polyimide resin, a polyamide resin, or a perylene resin. The first insulating layer IL1 may cover the first conductive layer.

As illustrated in FIG. 7B, the second conductive layer SP1 is located on the first insulating layer IL1 and is covered by the second insulating layer IL2. The step compensation film SCF1 may be located on the second insulating layer IL2 of the input sensing substrate ISP1. The second insulating layer IL2 located between the second conductive layer SP1 and the step compensation film SCF1 may be omitted. In addition, according to some embodiments, an additional insulating layer may further be located between the step compensation film SCF1 and the second insulating layer IL2. The additional insulating layer may be any one among an organic insulating layer, a high refractive index layer, or a dielectric constant compensation layer.

Figure 8A:
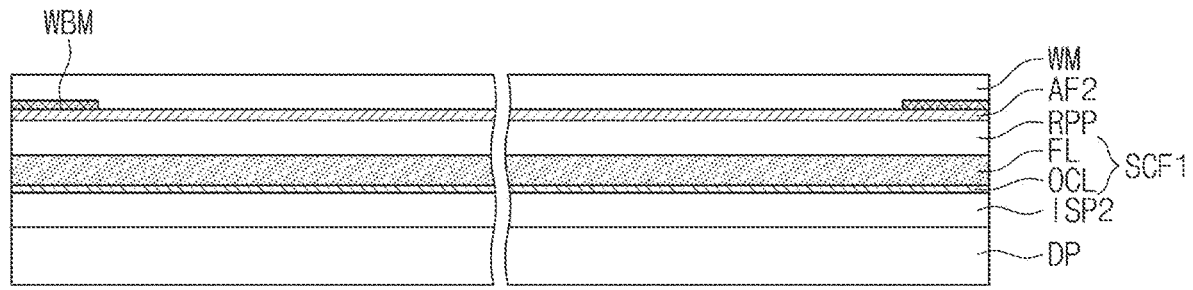
FIG. 8A is a cross-sectional view of a display device according to some embodiments of the inventive concept.
Figure 8B:
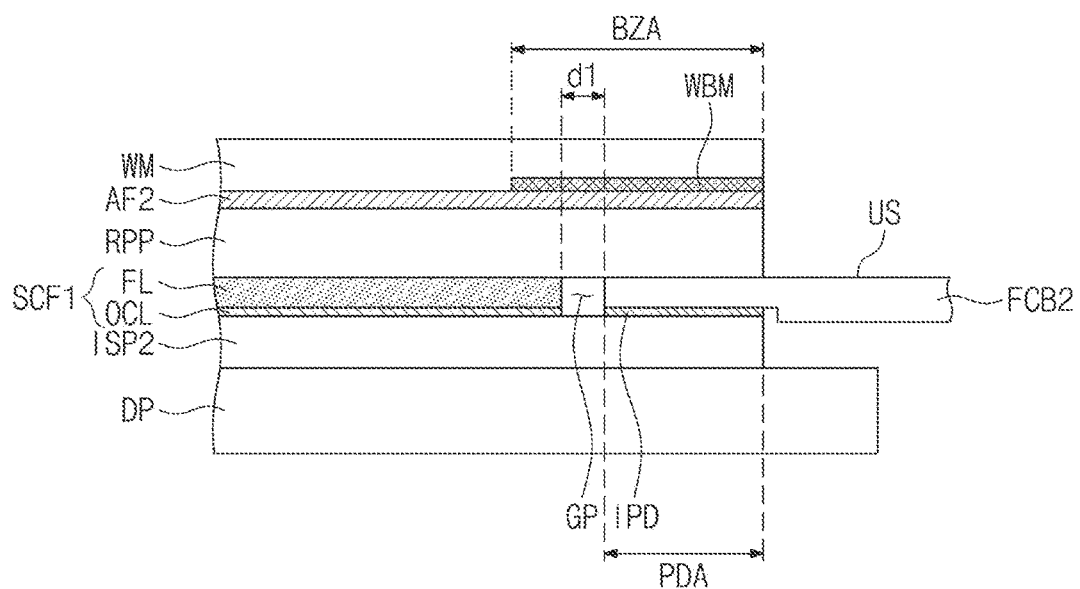
FIG. 8B is a partial expanded cross-sectional view of a display device according to some embodiments of the inventive concept.

FIG. 8A is a perspective view of a display device according to some embodiments of the inventive concept, and FIG. 8B is a partial expanded cross-sectional view of a display device according to some embodiments of the inventive concept. Among the constituents illustrated in FIGS. 8A and 8B, the same constituents as the constituents illustrated in FIGS. 3B to 3D will be referred to by the same reference symbols, and specific descriptions thereon will be omitted.

Referring to FIGS. 8A and 8B, in the display device DD (see FIG. 1B) according to some embodiments of the inventive concept, an input sensing layer ISP2 may be directly located on a display panel DP. In this description, the term "directly located" means that an adhesive film is not located between the input sensing layer ISP2 and the display panel DP. That is, the input sensing layer ISP2 may be formed on the display panel DP through a continuous process.

A step compensation film SCF1 may be located on the input sensing layer ISP2. The step compensation film SCF1 may be located in the remaining regions excluding a pad region PDA of the input sensing substrate ISP2. A plurality of pads IPD for being coupled to a second flexible circuit film FCB2 may be located on one side of the upper surface of the input sensing substrate ISP2. Here, a region in which the pads IDP are located may be defined as the pad region PDA.

The input sensing substrate ISP2 is coupled to the second flexible circuit film FCB2 in the pad region PDA. The step compensation film SCF1 may be located in the remaining regions excluding the pad region PDA so as to cover the upper surface of the input sensing substrate ISP2. The step compensation film SCF1 may not overlap the second flexible film FCB2. According to some embodiments of the inventive concept, the step compensation film SCF1 may be arranged so as to be spaced a certain distance from the second flexible circuit film FCB2. The spacing distance between the step compensation film SCF1 and the second flexible circuit film FCB2 may be defined as a first distance d1.

An air gap GP is formed between the step compensation film SCF1 and the second flexible circuit film FCB2 by the a first distance d1 formed by separating the step compensation film SCF1 and the second flexible circuit film FCB2. The distance between the step compensation film SCF1 and an end of the second flexible circuit film FCB2 is maintained at the first distance d1, and thus, the air gap GP may be formed at a certain size along the end of the second flexible circuit film FCB2.

According to some embodiments of the inventive concept, the configuration of the step compensation film SCF1 may have a configuration similar to the step compensation films SCF1 to SCF3 illustrated in FIGS. 3B to 5B. Thus, specific descriptions on the step compensation film SCF1 will be omitted.

Figure 9A:
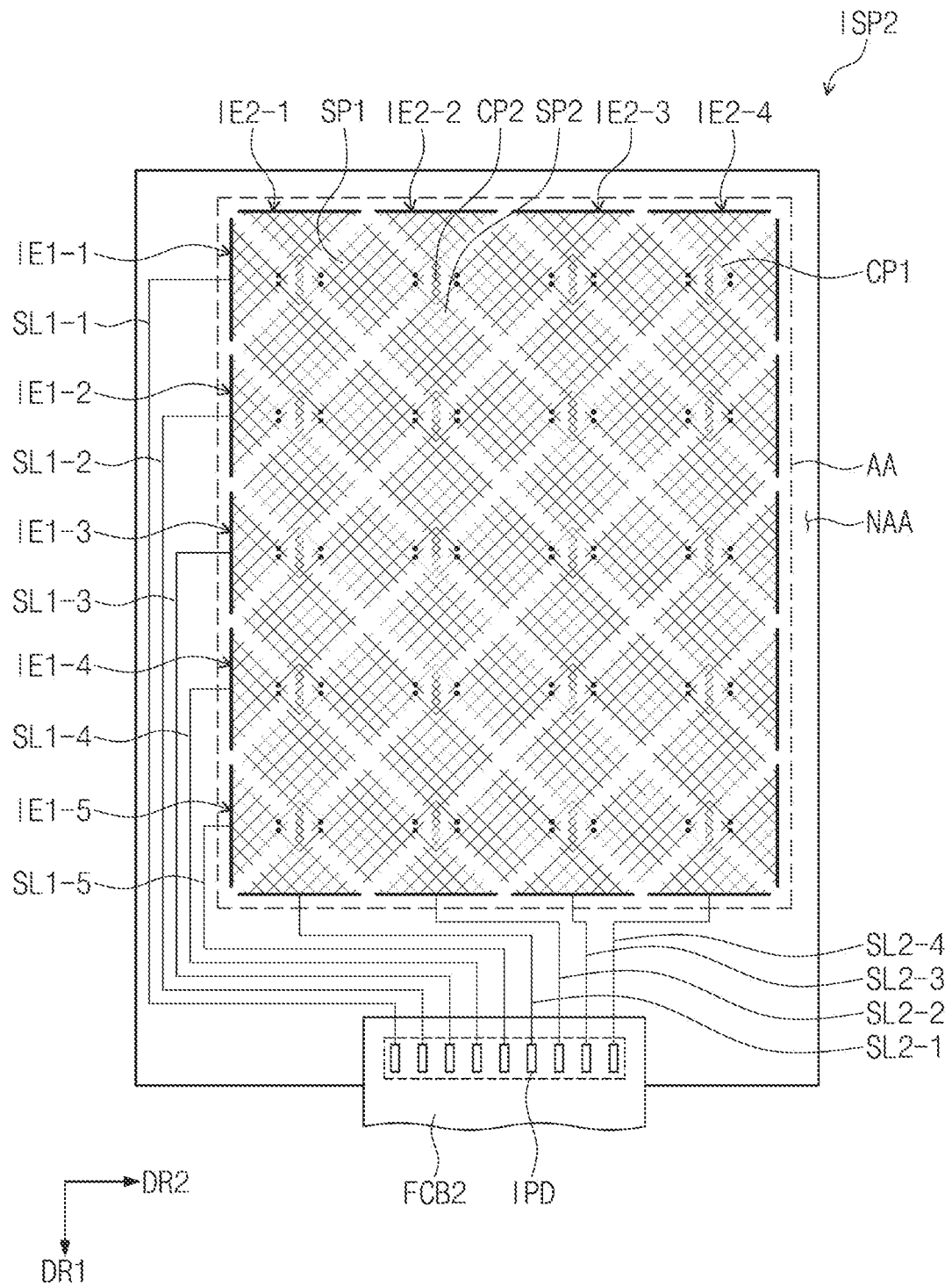
FIG. 9A is a plan view illustrating a configuration of an input sensing layer illustrated in FIG. 8A according to some embodiments of the inventive concept.
Figure 9B:
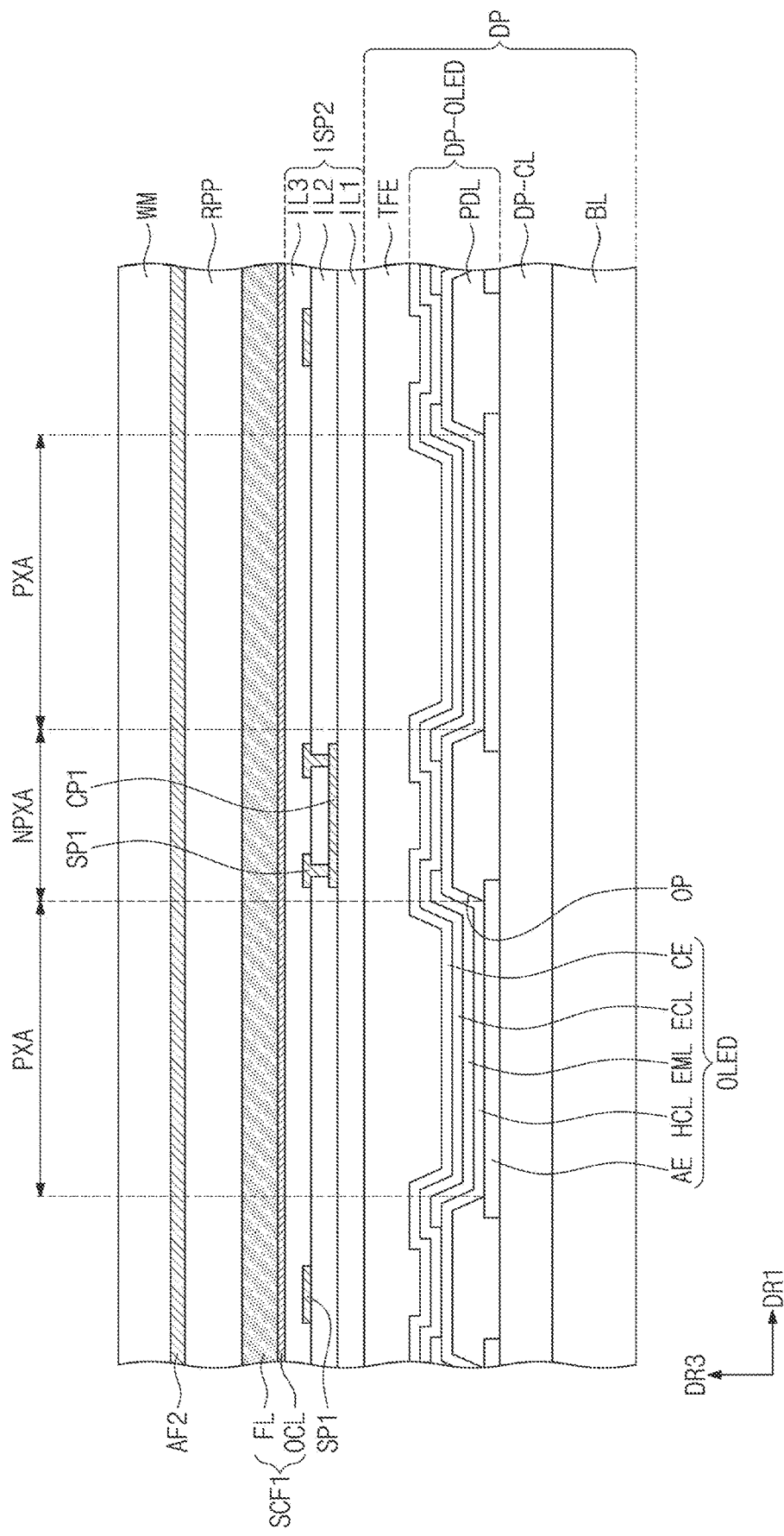
FIG. 9B is a detailed cross-sectional view illustrated in FIG. 8A according to some embodiments of the inventive concept.

FIG. 9A is a plan view illustrating a configuration of an input sensing layer according to some embodiments of the inventive concept; and FIG. 9B is a cross-sectional view of a display device according to some embodiments of the inventive concept. Among the constituents illustrated in FIGS. 9A, the same constituents as the constituents illustrated in FIG. 7A will be referred to by the same reference symbols, and specific descriptions thereon will be omitted.

Referring to FIGS. 9A and 9B, an input sensing layer ISP2 according to some embodiments of the inventive concept includes first sensing electrodes IE1-1 to IE1-5 and second sensing electrodes IE2-1 to IE2-4. The first sensing electrodes IE1-1 to IE1-5 and the second sensing electrodes IE2-1 to IE2-4 may have mesh shapes. Due to have mesh shapes, parasitic capacitance between electrodes AC and CE of the display panel DP and the first sensing electrodes IE1-1 to IE1-5 and the second sensing electrodes IE2-1 to IE2-4 may decrease. In addition, the first sensing electrodes IE1-1 to IE1-5 and the second sensing electrodes IE2-1 to IE2-4 do not overlap, and thus, the display device DD may not be viewed by a user.

The first sensing electrodes IE1-1 to IE1-5 and the second sensing electrodes IE2-1 to IE2-4 which have mesh shapes may contain silver, aluminum, copper, chromium, nickel or titanium, and the embodiments of the inventive concept are not limited thereto. Even when the input sensing layer ISP2 is formed through a continuous process, damage to an organic light-emitting diodes OLED may be prevented.

As illustrated in FIG. 9B, the display panel DP include a panel base layer BL, a circuit element layer DP-CL located on the panel base layer BL, a display element layer DP-OLED, and a thin film sealing layer TFE. According to some embodiments, the display panel DP may further include functional layers such as the anti-reflection layer or a refractive index adjustment layer.

The panel base layer BL may include a synthetic resin film. The synthetic resin layer is formed on a work board used during manufacturing of the display panel DP. Subsequently, conductive layers, insulating layers, etc. are formed on the synthetic resin layer. When the work board is removed, the synthetic resin layer corresponds to the panel base layer BL. The synthetic resin layer may be a polyimide-based resin layer, and the material thereof is not particularly limited. Besides, the panel base layer BL may include a glass substrate, a metal substrate, or an organic/inorganic composite material substrate, or the like.

The circuit element layer DP-CL may include at least one intermediate insulating layer and circuit elements. Hereinafter, the insulating layer included in the circuit element layer DP-CL is referred to as an intermediate insulating layer. The intermediate insulating layer may include at least one intermediate inorganic film and at least one intermediate organic film. The circuit elements include signal lines, a drive circuit for pixels, and the like. The circuit element layer DP-CL may be formed through: a process for forming an insulating layer, a semiconductor layer and a conductive layer by coating, deposition, etc.; and a process for patterning the insulating layer, the semiconductor layer and the conductive layer by a photolithography process.

The display element layer DP-OLED may include a pixel definition film PDL and an organic light-emitting element OLED. The pixel definition film PDL may include an organic material. A first electrode AE is located on the circuit element layer DP-CL. The pixel defining film PDL is formed on the first electrode AE. An opening part OP is defined in the pixel definition film PDL. The opening OP of the pixel definition film PDL exposes at least a portion of the first electrode AE. According to some embodiments of the inventive concept, the pixel definition film PDL may be omitted.

The display panel DP may include a light-emitting region PXA and a non-light-emitting region NPXA adjacent to the light-emitting region PXA. The non-light-emitting region NPXA may surround the light-emitting region PXA. According to some embodiments, the light-emitting region PXA is defined corresponding to a portion of the first electrode AE exposed by the opening part OP.

A hole control layer HCL may be commonly arranged in the light-emitting region PXA and the non-light-emitting region NPXA. An emission layer EML is located on the hole control layer HCL. The emission layer EML may be located on a region corresponding to the opening part OP. That is, the emission layer EML may be formed so as to be distributed to each of the pixels PX. The emission layer EML may include an organic material and/or an inorganic material. The emission layer EML may generate a light (e.g., a set or predetermined color light) with a color.

According to some embodiments, a patterned emission layer EML is illustrated as an example, but the emission layer EML may be located in the light-emitting region PXA. At this point, the emission layer EML may also generate white light. In addition, the emission layer EML may have a multilayer structure referred to as a tandem.

An electron control layer ECL is located on the emission layer EML. According to some embodiments, the electron control layer ECL may be commonly formed in the light-emitting region PXA and the non-light-emitting region NPXA. A second electrode CE is located on the electron control layer ECL. The second electrode CE is commonly arranged with or utilized by the pixels PX.

The thin film sealing layer TFE is located on the second electrode CE. The thin film sealing layer TFE seals the display element layer DP-OLED. The thin film sealing layer TFE may include at least one insulating layer. The thin film sealing layer TFE according to some embodiments of the inventive concept may include at least one inorganic film (hereinafter, referred to as sealing inorganic film). The thin film sealing layer TFE according to some embodiments of the inventive concept may include at least one organic film (hereinafter, referred to as sealing organic film) and at least one sealing inorganic film.

The sealing inorganic film protects the display element layer DP-OLED, and the sealing organic film protects the display element layer DP-OLED from foreign substances such as dusts. The sealing inorganic film may include a silicon nitride layer, a silicon oxynitride layer, a silicon oxide layer, a titanium oxide layer, or an aluminum oxide layer, and the embodiments of the inventive concept are not limited thereto. The sealing organic film may include an acrylic organic film and the embodiments of the inventive concept are not limited thereto.

The input sensing layer ISP2 includes a first insulating layer IL1, first and second conductive layers which are located on the first insulating layer, a second insulating layer IL2 and a third insulating layer IL3. The first insulating layer IL1 may include an inorganic material, for example, a silicon nitride. The sealing inorganic film located on the uppermost side of the thin film sealing layer TFE may also include silicon nitride, and the sealing inorganic film of the thin film sealing layer TFE and the first insulating layer IL1 may formed under different deposition conditions. The first conductive layer is located on the first insulating layer IL1.

The first conductive layer may include a first connection part CP1. The second conductive layer may include a first sensing part SP1, a second sensing part SP2, and a second connection part CP2. The second conductive layer is located on the first conductive layer. The second insulating layer IL2 is located between the first conductive layer and the second conductive layer. The first conductive layer and the second conductive layer are spaced apart from each other by the second insulating layer IL2 on a cross-section. A contact hole for partially exposing the first connection part CP1 is provided in the second insulating layer IL2, and the first sensing part SP1 may be connected to the first connection part CP1 through the contact hole. The third insulating layer IL3 is located on the second insulating layer IL2. The third insulating layer IL3 may cover the second conductive layer. The third insulating layer IL3 protects the second conductive layer from external environment.

The first sensor part SP1 does not overlap the light-emitting regions PXA, but overlaps the non-light-emitting region NPXA. Mesh lines of the first sensor part SP1 may define a plurality of mesh holes. The mesh lines may have a three-layer structure of titanium/aluminum/titanium. The mesh holes may correspond one to one to the light-emitting regions PXA. However, the embodiments of the inventive concept are not limited thereto. That is, the mesh holes may each correspond to two or more light-emitting regions PXA.

The step compensation film SCF1 may be located on the third insulating layer IL3 of the input sensing layer ISP2. However, the third insulating layer IL3 located between the second conductive layer SP1 and the step compensation film SCF1 may be omitted. In addition, according to some embodiments, an additional insulating layer may further be located between the step compensation film SCF1 and the third insulating layer IL3. The additional insulating layer may be any one among an organic insulating layer, a high refractive index layer, or a dielectric constant compensation layer.

According to some embodiments of the inventive concept, the configuration of the step compensation film SCF1 may have a configuration similar to the step compensation films SCF1 to SCF3 illustrated in FIGS. 3B to 5B. Thus, specific descriptions on the step compensation film SCF1 will be omitted.

According to some embodiments of the inventive concept, in a structure provided with the anti-reflection film on the input sensing substrate, the step compensation film may be located between the input sensing substrate and the anti-reflection film in order to prevent or reduce formation of an air gap in an irregular manner and in a non-fixed shape by the flexible circuit film stuck to the input sensing substrate.

That is, step differences between the input sensing substrate and the flexible circuit film may be removed or reduced, and as a result, an air gap is formed in a standardized (or regular) shape between end of the step compensation film and an end of the flexible circuit film. Thus, an unnecessary increase in the width of a bezel region due to an air gap formed in a non-fixed shape may be prevented or reduced.

So far, the inventive concept has been described in connection with some example embodiments thereof. However, those of ordinary skill in the art will recognize that various modifications and variations are possible without departing from the spirit and scope set forth in the following claims, and their equivalents. In addition, embodiments disclosed herein are not intended to limit the spirit and scope of the inventive concept. Rather, the appended claims and all technical idea within the range equivalent thereto should be understood to be included in the spirit and scope of the inventive concept.

What is claimed is:

1. A display device comprising:
a display panel configured to display an image;
an input sensing substrate on the display panel;
a flexible circuit film coupled to one side of an upper surface of the input sensing substrate;
a step compensation film spaced apart from the flexible circuit film on the upper surface of the input sensing substrate; and
a window on the flexible circuit film and the step compensation film,
wherein the step compensation film comprises:
a compensation layer on the upper surface of the input sensing substrate, and
an overcoat layer between the compensation layer and the input sensing substrate,
wherein a thickness of the compensation layer and a thickness of the overcoat layer are set depending on a thickness of the flexible circuit film.

2. The display device of claim 1, wherein a spacing distance between the compensation layer and the flexible circuit film is equal to a spacing distance between the overcoat layer and the flexible circuit film.

3. The display device of claim 2, wherein the compensation layer is an optically clear adhesive.

4. The display device of claim 2, wherein the overcoat layer contains a curing material and an adhesive material to couple the compensation layer to the input sensing substrate.

5. The display device of claim 1, wherein a thickness of the step compensation film is greater than a thickness of the flexible circuit film and is smaller than or equal to a distance between the window and the input sensing substrate which are spaced apart from each other by the flexible circuit film.

6. The display device of claim 5, wherein:
the input sensing substrate further comprises a pad for electrical contact with the flexible circuit film; and
a thickness of the step compensation film is equal to a sum of a thickness of the flexible circuit film and a thickness of the pad.

7. The display device of claim 1, further comprising an anti-reflection film disposed between the window and the input sensing substrate.

8. The display device of claim 7, wherein the anti-reflection film comprises a polarization layer,
the polarization layer contains a polyvinyl alcohol.

9. The display device of claim 8, wherein the step compensation film further comprises a barrier layer between the compensation layer and the anti-reflection film.

10. The display device of claim 9, wherein the barrier layer comprises any one material among a cyclic olefin polymer (COP), polycarbonate (PC) or polyimide (PI).

11. The display device of claim 1, wherein the input sensing substrate comprises:
a base layer; and
a conductive layer formed on the base layer, and
the overcoat layer is on the conductive layer.

12. The display device of claim 1, wherein the window comprises a window light shield pattern on a rear surface of the window, the window light shield pattern at least partially overlaps the flexible circuit film.

13. The display device of claim 12, wherein the step compensation film at least partially overlaps the window light shield pattern.

14. A display device comprising:
a display panel configured to display an image;
an input sensing substrate on the display panel;
a flexible circuit film coupled to one side of an upper surface of the input sensing substrate;
a step compensation film spaced apart from the flexible circuit film on the upper surface of the input sensing substrate; and
an anti-reflection film on the flexible circuit film and the step compensation film,
wherein the step compensation film comprises:
an overcoat layer on the upper surface of the input sensing substrate; and
a barrier layer between the overcoat layer and the anti-reflection film and configured to block inflow of corrosive harmful matter from the anti-reflection film,
wherein a thickness of the barrier layer and a thickness of the overcoat layer are set depending on a thickness of the flexible circuit film.

15. The display device of claim 14, wherein a spacing distance between the overcoat layer and the flexible circuit film is equal to a spacing distance between the barrier layer and the flexible circuit film.

16. The display device of claim 14, wherein the anti-reflection film comprises a polarization layer,
the polarization layer contains a polyvinyl alcohol.

17. The display device of claim 16, wherein the overcoat layer contains a curing material and an adhesive material to couple a compensation layer to the input sensing substrate, and
the barrier layer comprises any one material among a cyclic olefin polymer (COP), polycarbonate (PC) or polyimide (PI).

18. A method for manufacturing a display device, the method comprising:
arranging an input sensing substrate on a display panel;
coupling a flexible circuit film on one side of an upper surface of the input sensing substrate;
laminating a preliminary compensation layer and a preliminary overcoat layer to form a preliminary step compensation film;
coupling the preliminary step compensation film on the upper surface of the input sensing substrate;
curing the preliminary step compensation film to form a step compensation film comprising a compensation layer on the upper surface of the input sensing substrate and an overcoat layer between the compensation layer and the input sensing substrate; and
coupling a window on the step compensation film,
wherein a thickness of the compensation layer and a thickness of the overcoat layer are set depending on a thickness of the flexible circuit film.

19. The method of claim 18, wherein the compensation layer comprising an optically clear adhesive,
the overcoat layer contains a curing material and an adhesive material to couple the compensation layer to the input sensing substrate,
wherein a spacing distance between the compensation layer and the flexible circuit film is equal to a spacing distance between the overcoat layer and the flexible circuit film.

20. The method of claim 18, further comprising disposing an anti-reflection film between the window and the step compensation film,
wherein the step compensation film further comprises a barrier layer between the compensation layer and the anti-reflection film, the barrier layer comprises any one material among a cyclic olefin polymer (COP), polycarbonate (PC) or polyimide (PI).

\* \* \* \* \*